United States Patent [19]
Newman et al.

[11] Patent Number: 5,621,680
[45] Date of Patent: Apr. 15, 1997

[54] DATA STORAGE ELEMENT AND METHOD FOR READING DATA THEREFROM

[75] Inventors: David A. Newman, Tempe; Ziye Zhou, Phoenix, both of Ariz.

[73] Assignee: Motorola, Inc., Schaumburg, Ill.

[21] Appl. No.: 617,724

[22] Filed: Apr. 1, 1996

[51] Int. Cl.$^6$ .................................................. G11C 11/24
[52] U.S. Cl. ........................... 365/145; 365/149; 365/210
[58] Field of Search .................................... 365/145, 149, 365/210, 189.09

[56] References Cited

U.S. PATENT DOCUMENTS

| | | | |
|---|---|---|---|
| 4,545,036 | 10/1985 | Segers | 365/210 |
| 4,669,065 | 5/1987 | Ohsawa | 365/210 |
| 4,734,890 | 3/1988 | Miyatake et al. | 365/210 |
| 4,873,664 | 10/1989 | Eaton, Jr. | 365/145 |
| 5,297,084 | 3/1994 | Ban | 365/210 |

OTHER PUBLICATIONS

Tatsumi Sumi et al., Integrated Ferroelectrics, "Integrated Ferroelectric Nonvolatile Memory Technology for 1T/1C Cell with 100ns Read/Write Time at 3V", 1995, vol. 6, pp. 1–13.

*Primary Examiner*—Tan T. Nguyen
*Attorney, Agent, or Firm*—Rennie William Dover

[57] ABSTRACT

A non-volatile memory unit (10) includes a memory cell (13) and a reference cell (20). The memory cell (13) includes a ferroelectric memory capacitor (14), which is polarized to store a logic data. The reference cell (20) includes two ferroelectric reference capacitors (25, 26) which are in polarization states (51, 52) complementary to each other. The capacitance of the reference capacitor (25, 26) tracks the capacitance of the memory capacitor (14). When reading data from the memory unit (10), an extraction signal (19A) generates a data voltage depending on the data stored in the memory unit (10), and a reference extraction signal (39A) generates a reference voltage through the reference capacitors (25, 26). A sense amplifier (42) senses the data voltage and the reference voltage, thereby reading data from the memory unit (10).

20 Claims, 7 Drawing Sheets

5,621,680

DATA STORAGE ELEMENT AND METHOD FOR READING DATA THEREFROM

BACKGROUND OF THE INVENTION

The present invention relates, in general, to data storage elements, and more particularly, to nonvolatile memory units.

A ferroelectric random access memory (FERAM) is generally considered superior to other types of nonvolatile memory in terms of data transfer rate, fatigue characteristics, operating voltage, etc. Two predominant FERAM configurations are a two transistor, two ferroelectric capacitor per bit (2T/2C) configuration and a one transistor, one ferroelectric capacitor per bit (1T/1C) configuration. Because of its small size, the 1T/1C configuration is preferred in high packing density and low power applications, such as portable computers, personal communications, smart cards, and radio frequency identification tags.

In a memory cell with a 1T/1C configuration, a ferroelectric memory capacitor stores a logic state representing the data stored in the memory cell. When reading data from the memory cell, an extraction voltage is applied to the ferroelectric memory capacitor to extract the polarization charge from the memory capacitor. The extracted polarization charge is transmitted to a parasitic bit line capacitor. The voltage across the parasitic bit line capacitor is compared with a reference voltage to determine whether the data read from the memory cell is a logic high or logic low.

The reference voltage is typically provided by a ferroelectric reference capacitor which has a larger capacitance than that of the memory capacitor. The reference capacitor is polarized in a logic low state. When reading data from the memory cell, the extraction voltage is applied to both the memory capacitor and the reference capacitor. A reference charge is extracted from the reference capacitor and transmitted to a parasitic reference bit line capacitor. When the amount of charge extracted from the reference capacitor is larger than the amount of charge extracted from the memory capacitor, the memory cell is storing a logic low state. When the amount of charge extracted from the reference capacitor is smaller than the charge extracted from the memory capacitor, memory cell is storing a logic high state. Thus, reading data from the memory cell includes comparing the voltage across the bit line capacitor with the voltage across the reference bit line capacitor.

The data is correctly read from the memory cell only if the capacitance of the reference capacitor is larger than the capacitance of the memory capacitor by a specified value or range of values. To ensure the difference in capacitance values meets the specified range, it is important to properly control the fabrication process of the ferroelectric capacitor. Since the capacitance value of a ferroelectric capacitor are dependent on process and/or temperature variations, the capacitance of a ferroelectric capacitor is determined by the process used to fabricate the FERAM. Therefore, the results of reading data from the 1T/1C FERAM are sensitive to process and temperature variations.

Accordingly, it would be advantageous to have a FERAM structure and a method for reading data from the FERAM structure which are reliable and insensitive to process and temperature variations. It is desirable for the FERAM structure to be simple and compact. It is also desirable that the process of reading data from the FERAM structure be fast and energy efficient.

DETAILED DESCRIPTION OF THE DRAWINGS

Generally, the present invention provides a non-volatile data storage element and a method for reading data from the non-volatile data storage element. More particularly, the present invention provides a non-volatile data storage element that uses a 1T/1C FERAM structure and two reference ferroelectric capacitors for providing a reliable reference voltage during the process of reading data from the FERAM. To achieve the improved reliability, the two reference ferroelectric capacitors are preferably fabricated in the same process and have the same shape and size as the ferroelectric capacitors in the memory cells of FERAM. Further, the two reference ferroelectric capacitors are in complementary polarization states.

Figure 1:
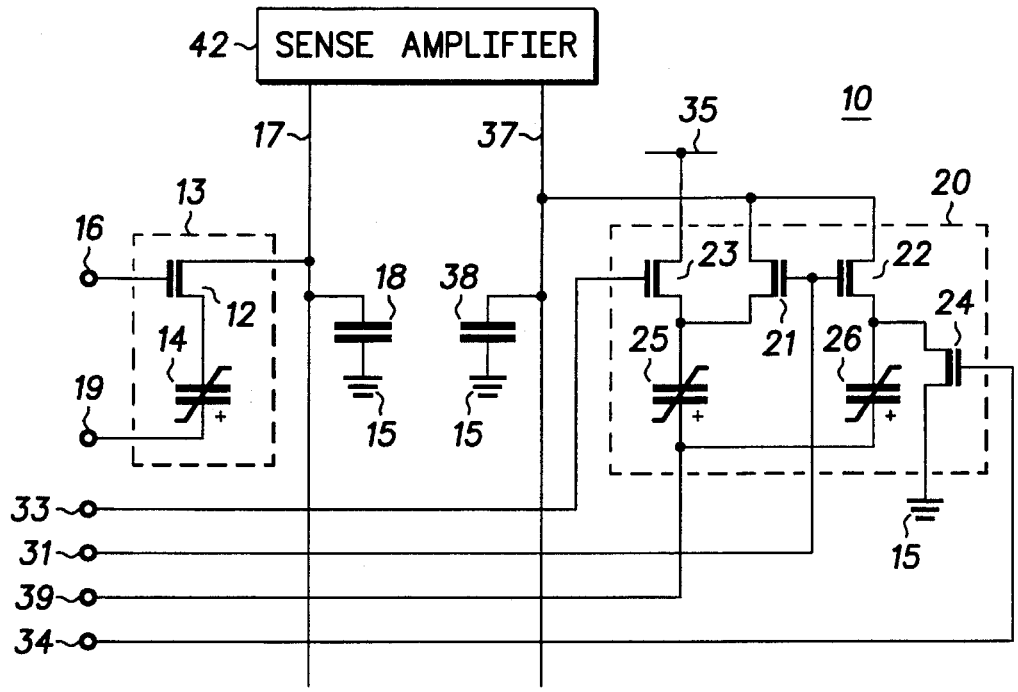
FIG. 1 is a schematic diagram of a non-volatile data storage element in accordance with a first embodiment of the present invention.

FIG. 1 is a schematic diagram of a non-volatile data storage element 10 in accordance with a first embodiment of the present invention. It should be noted that a data storage element is also referred to as a memory unit. Data storage element 10 includes an n-channel insulated gate field effect transistor (FET) 12 and a ferroelectric capacitor 14 which cooperate to form a memory cell 13. A gate electrode of FET 12 is connected to a word line 16; a source electrode of FET 12 is connected to a first electrode of ferroelectric capacitor 14; and a drain electrode of FET 12 is connected to a bit line 17. A parasitic bit line capacitor 18 is between bit line 17 and a voltage supply conductor 15. By way of example, voltage supply conductor 15 is coupled for receiving a ground potential. A second electrode of ferroelectric capacitor 14 is connected to a plate line 19. The operations of a word line, a bit line, and a plate line in memory applications are well known to those skilled in the art. FET 12 serves as a pass gate for memory cell 13. Ferroelectric capacitor 14 functions as a memory capacitor for memory cell 13, wherein the polarization state of ferroelectric capacitor 14 determines the logical value of the data stored in data storage element 10. The voltage across ferroelectric capacitor 14 is defined as positive when the potential at its electrode connected to plate line 19, i.e. the electrode identified with a positive sign in FIG. 1, is higher than the potential at its electrode connected to FET 12. The polarity of the polarization charge in ferroelectric capacitor 14 is defined as positive when the charge on the electrode with the positive sign (FIG. 1) is positive.

Although FIG. 1 shows FET 12 as an insulated gate field effect transistor, this is not a limitation of the present invention. FET 12 may be replaced by any switch having a control electrode and current conducting electrodes such as, for example, a complementary metal oxide semiconductor (CMOS) pass gate, a bipolar transistor, a metal semiconductor field transistor (MESFET), or the like. As those skilled in the art are aware, when using a FET as a switch, the gate electrode of the FET corresponds to the control electrode of the switch, and the source and drain electrodes of the FET correspond to the current conducting electrodes of the switch.

Data storage element 10 also includes a reference cell 20, which is comprised of n-channel insulated gate FETs 21, 22, 23, and 24, and ferroelectric capacitors 25 and 26. A gate electrode of FET 21 is connected to a reference word line 31; a source electrode of FET 21 is connected to a source electrode of FET 23 and to a first electrode of ferroelectric capacitor 25; and a drain electrode of FET 21 is connected to a reference bit line 37. A gate electrode of FET 23 is connected to a reset line 33 and a drain electrode of FET 23 is connected to a voltage supply conductor 35. By way of example, voltage supply conductor 35 is coupled for receiving a voltage such as, for example, $V_{DD}$. A second electrode of ferroelectric capacitor 25 is connected to reference plate line 39. Likewise, a gate electrode of FET 22 is connected to reference word line 31 and to the gate electrode of FET 21; a source electrode of FET 22 is connected to a source electrode of FET 24 and to a first electrode of ferroelectric capacitor 26; and a drain electrode of FET 22 is connected to reference bit line 37. A gate electrode of FET 24 is connected to a reset line 34 and a drain electrode of FET 24 is connected to voltage supply conductor 15. A second electrode of ferroelectric capacitor 26 is connected to reference plate line 39. A parasitic capacitor 38 is between reference bit line 37 and voltage supply conductor 15. Ferroelectric capacitors 25 and 26 serve as reference capacitors which provide a reference voltage when reading data from data storage element 10. The voltage across ferroelectric capacitor 25 is defined as positive when the potential at its electrode connected to reference plate line 39, i.e., the electrode identified with a positive sign in FIG. 1, is higher than the potential at its electrode connected to the source electrodes of FETs 21 and 23. Likewise, the voltage across ferroelectric capacitor 26 is defined as positive when the potential at its electrode connected to reference plate line 39, i.e., the electrode identified with a positive sign in FIG. 1, is higher than the potential at its electrode connected to the source electrodes of FETs 22 and 24. The polarity of the polarization charge in ferroelectric capacitors 25 and 26 is defined as positive when the charge on the electrode of the corresponding capacitor with the positive sign (FIG. 1) is positive.

Preferably, ferroelectric capacitors 14, 25, and 26 are fabricated using the same process. Further, the sizes and shapes of ferroelectric capacitors 14, 25, and 26 are preferably identical to each other. Thus, the capacitance of ferroelectric capacitor 25 and the capacitance of ferroelectric capacitor 26 track the capacitance of ferroelectric capacitor 14. It is also preferred that the capacitance of parasitic capacitor 38 be twice the capacitance of parasitic capacitor 18.

FETs 21 and 22 serve as switches for transmitting a reference signal from ferroelectric capacitors 25 and 26 to reference bit line 37. FETs 23 and 24 serve as switches for coupling ferroelectric capacitors to voltage supply conductors 35 and 15, respectively. Although FIG. 1 shows FETs 21, 22, 23, and 24 as insulated gate field effect transistors, this is not a limitation of the present invention. FETs 21, 22, 23, and 24 may be replaced by any type of switch having control electrodes and current conducting electrodes such as, for example, CMOS pass gates, bipolar transistors, MESFETs, or the like.

Data storage element 10 further includes a sense amplifier 42. A first terminal if sense amplifier 42 is connected to bit line 17 of memory cell 13 and a second terminal of sense amplifier 42 is connected to reference bit line 37 of reference cell 20. As those skilled in the art are aware, a sense amplifier senses the potential difference between its two terminals and generates a voltage across its two terminals. The generated voltage is larger than the potential difference and has the same polarity as the potential difference. Further, the sense amplifier pulls its two terminals to ground potential upon receiving a pull down signal.

Figure 2:
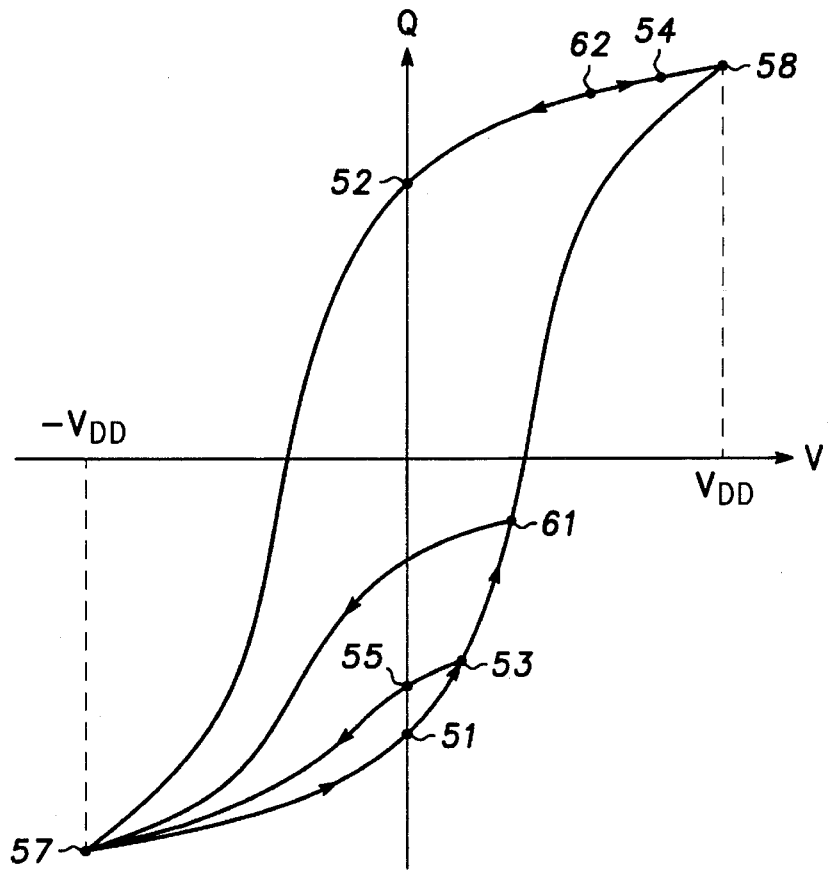
FIG. 2 is a hysteresis loop of polarization charge as a function of voltage in a ferroelectric capacitor.

FIG. 2 is a hysteresis loop 50 of polarization charge (Q) as a function of voltage (V) in a ferroelectric capacitor. Hysteresis loop 50 has two polarization states, 51 and 52 that are complementary to each other. When the voltage across a ferroelectric capacitor is at a reference value $-V_{DD}$ (FIG. 2), the ferroelectric capacitor is fully polarized to a saturation state 57. When the voltage across a ferroelectric capacitor is at a reference value $+V_{DD}$ (FIG. 2), the ferroelectric capacitor is fully polarized to a saturation state 58. When the voltage across a fully polarized ferroelectric capacitor is zero, the fully polarized ferroelectric capacitor is in either polarization state 51 or polarization state 52. More particularly, when memory cell 13 stores a logic data and the voltage across ferroelectric capacitor 14 is zero, ferroelectric capacitor 14 is in either polarization state 51 or polarization state 52 depending on the logical value of the data stored in data storage element 10 of FIG. 1. If a first logical value such as, for example, a logic "one", is stored in data storage element 10 of FIG. 1, capacitor 14 is in polarization state 51. If a second logical value such as, for example, a logic "zero", which is complementary to the first logical value, is stored in data storage element 10 of FIG. 1, capacitor 14 is in polarization state 52. Ferroelectric capacitor 14 of FIG. 1 may enter intermediate states 53 and 54, a neutral state 55, or saturation states 57 and 58 in hysteresis loop 50 during a reading operation, as discussed with reference to FIG. 3. Ferroelectric capacitors 25 and 26 of FIG. 1 are in polarization states 51 and 52, respectively, when the voltages across ferroelectric capacitors 25 and 26 are zero. During the reading operation, ferroelectric capacitor 25 may enter an intermediate state 61 and saturation state 57, whereas ferroelectric capacitor 26 may enter an intermediate state 62 and saturation state 58.

Figure 3:
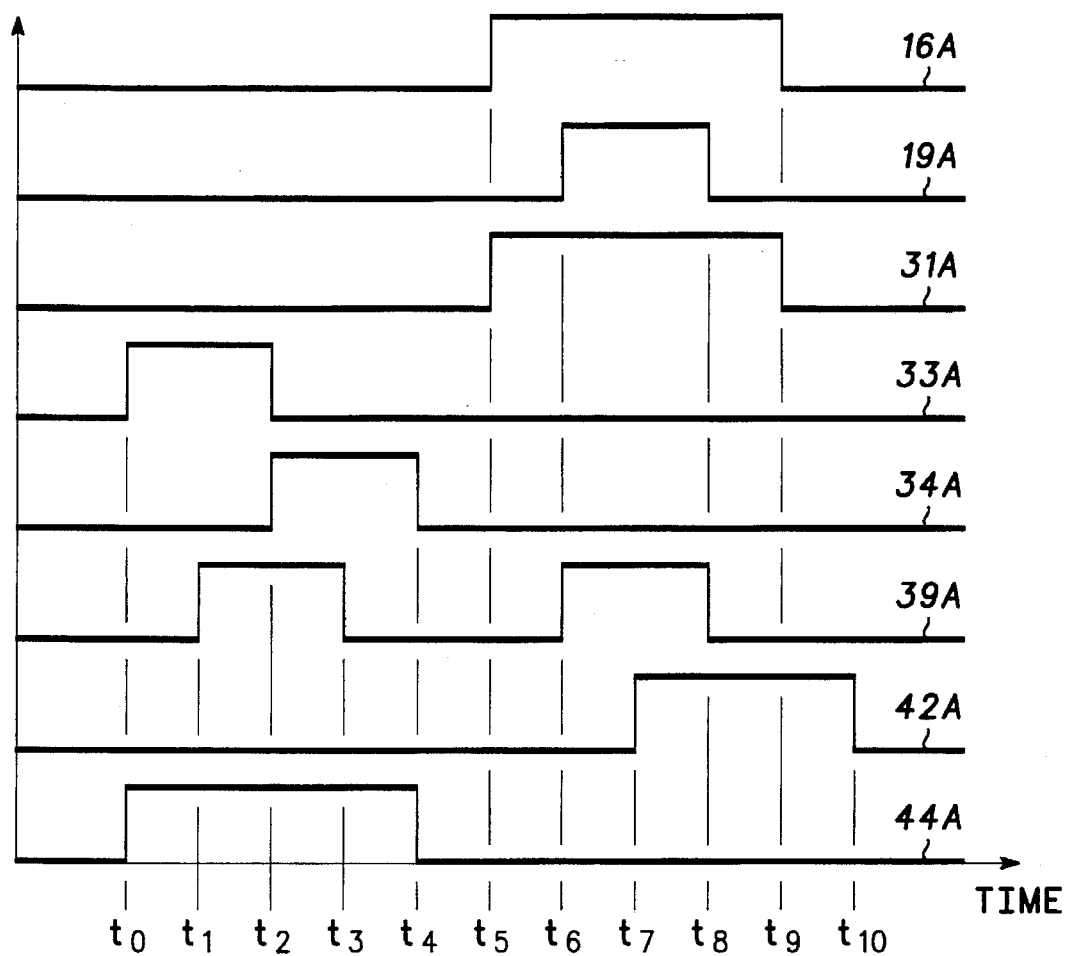
FIG. 3 is a timing diagram of signals used for reading data from the data storage element of FIG. 1 in accordance with the present invention.

FIG. 3 is a timing diagram 80 of signals used for reading data from data storage element 10 of FIG. 1 in accordance with the present invention. Timing diagram 80 includes a memory control signal 16A, an extraction signal 19A, a reference control signal 31A, reset signals 33A and 34A, a reference extraction signal 39A, a sense amplification signal 42A, and a pull down signal 44A. It should be noted that memory control signal 16A, extraction signal 19A, reference extraction signal 39A, and sense amplification signal 42A are also referred to as word line signal, plate line signal, reference plate line signal, and sense amplifier enable signal, respectively. When reading data from data storage element 10 of FIG. 1, memory control signal 16A is applied to word line 16, extraction signal 19A is applied to plate line 19, reference control signal 31A is applied to reference word line 31, reset signals 33A and 34A are applied to reset lines 33 and 34, respectively, reference extraction signal is applied to reference plate line 39, sense amplification signal 42A is applied to sense amplifier 42, and pull down signal 44A is applied to sense amplifier 42 for pulling bit line 17 and reference bit line 37 to ground potential.

Before a "read" command is executed, memory control signal 16A, extraction signal 19A, reference control signal 31A, and reset signals 33A and 34A are at ground. Thus, FETs 12, 21, 22, 23, and 24 of data storage element 10 shown in FIG. 1 are non-conductive. Further, the voltages across ferroelectric capacitors 14, 25, and 26 of data storage element 10 are zero. Ferroelectric capacitor 14 is either in polarization state 51 of hysteresis loop 50 in FIG. 2, (because data storage element 10 is storing a logic "one") or a polarization state 52 of hysteresis loop 50 in FIG. 2 (because data storage element 10 is storing a logic "zero"). The reading process starts at time $t_0$ of timing diagram 80 of FIG. 3 and is described herein with reference to FIGS. 1, 2, and 3 simultaneously.

At time $t_0$, FET 23 is switched on by reset signal 33A. By way of example, reset signal 33A is raised from ground to a voltage level of one threshold voltage of FET 23 above $V_{DD}$. A voltage of approximately $-V_{DD}$ is applied across ferroelectric capacitor 25 via reference plate line 39, voltage supply conductor 35, and FET 23. Thus, ferroelectric capacitor 25 is in saturation state 57 of hysteresis loop 50. In response to the rising edge of pull down signal 44A., sense amplifier 42 pulls bit line 17 and reference bit line 37 to ground potential to discharge bit line capacitor 18 and reference bit line capacitor 38.

At time $t_1$, reference extraction signal 39A is raised from ground to $V_{DD}$. The voltage across ferroelectric capacitor 25 is zero. Ferroelectric capacitor 25 is discharged and in polarization state 51 of hysteresis loop 50. Because FETs 22 and 24 are non-conductive, the state of ferroelectric capacitor 26 is not significantly affected by reference extraction signal 39A at time $t_1$.

At time $t_2$, FET 23 is switched off and FET 24 is switched on by reset signals 33A and 34A, respectively. By way of example, reset signal 33A is lowered to ground and reset signal 34A is raised from ground to a voltage level of one threshold voltage of FET 24 above $V_{DD}$. The voltage across ferroelectric capacitor 25 remains at zero and therefore ferroelectric capacitor 25 remains in polarization state 51. A voltage of approximately $+V_{DD}$ is applied across ferroelectric capacitor 26 via reference plate line 39, voltage supply conductor 15, and FET 24. Thus, ferroelectric capacitor 26 is in saturation state 58 of hysteresis loop 50.

At time $t_3$, reference extraction signal 39A is lowered to ground. The voltage across ferroelectric capacitor 26 is zero. Ferroelectric capacitor 26 is discharged and in polarization state 52 of hysteresis loop 50. Because FETs 21 and 23 are non-conductive, the state of ferroelectric capacitor 25 is not significantly affected by reference extraction signal 39A at time $t_3$.

At time $t_4$, reset signal 34A is lowered to ground, switching off FET 24. The voltage across ferroelectric capacitor 26 remains at zero and therefore ferroelectric capacitor 25 remains in polarization state 52. Further, sense amplifier 42 removes the ground potential applied to bit line 17 and reference bit line 37 in response to the falling edge of pull down signal 44A.

It should be understood that, in accordance with the present invention, the timing relations among reference extraction signal 39A, reset signals 33A and 34A, and pull down signal 44A between times $t_0$ and $t_4$ are not limited to being exactly the same as those of the embodiment shown and described with reference to timing diagram 80. For example, reset signal 34A may rise at any time before the occurrence of the falling edge of reference extraction signal 39A at time $t_3$ instead of rising simultaneously with the occurrence of the falling edge of reset signal 33A at time $t_2$ as shown in FIG. 3. Further, pull down signal 44A can be applied to sense amplifier 42 at any time before the occurrence of the rising edge of memory control signal 16A at time $t_5$.

At time $t_5$, FET 12 is switched on by memory control signal 16A, and FETs 21 and 22 are switched on by reference control signal 31A. By way of example, memory control signal 16A is raised from ground to a voltage level of one threshold voltage of FET 12 above the voltage $V_{DD}$. In addition, reference control signal 31A is raised from ground to a voltage level of one threshold voltage of FETs 21 and 22 above the voltage $V_{DD}$, at time $t_5$. Ferroelectric capacitor 14 is coupled between plate line 19 and voltage supply conductor 15 via the series combination of conductive FET 12 and bit line capacitor 18.

At time $t_6$, extraction signal 19A and reference extraction signal 39A are raised from ground to a voltage, $V_{DD}$. The voltage across ferroelectric capacitor 14 and bit line capacitor 18 is equal to the voltage $V_{DD}$ minus the voltage across the drain and source electrodes of conductive FET 12. The voltage across ferroelectric capacitor 25 and reference bit line capacitor 38 is $V_{DD}$ minus the voltage across the drain and source electrodes of conductive FET 21. Likewise, the voltage across ferroelectric capacitor 26 and reference bit line capacitor 38 is $V_{DD}$ minus the voltage across the drain and source electrodes of conductive FET 22.

If, for example, a logic "one" is stored in data storage element 10, ferroelectric capacitor 14 is initially in polarization state 51. An electric field created in capacitor 14 by the voltage across its electrodes is in the opposite direction from its initial polarization field. The electric field depolarizes capacitor 14 and may polarize capacitor 14 in the opposite direction depending on the ratio of the capacitance of capacitor 14 to that of bit line capacitor 18. The state of capacitor 14 changes from polarization state 51 to intermediate state 53 of hysteresis loop 50. The voltage across ferroelectric capacitor 14 is equal to the voltage difference between intermediate state 53 and polarization state 51. Further, the voltage across bit line capacitor 18 is approximately equal to the difference between $V_{DD}$ and the voltage at intermediate state 53 of hysteresis loop 50.

If, on the other hand, a logic "zero" is stored in data storage element 10, ferroelectric capacitor 14 is initially in polarization state 52. An electric field created in capacitor 14 by the voltage across its electrodes is in the same direction as its initial polarization field. The electric field further polarizes capacitor 14. The state of capacitor 14 changes from polarization state 52 to intermediate state 54 of hysteresis loop 50. The voltage across ferroelectric capacitor 14 is equal to the voltage difference between intermediate state 54 and polarization state 52. Further, the voltage across bit line capacitor 18 is approximately equal to the difference between $V_{DD}$ and the voltage at intermediate state 54 of hysteresis loop 50.

Ferroelectric capacitor 25 is placed in polarization state 51 by extraction signal 19A and reset signal 33A at time $t_1$ and remains in polarization state 51 until time $t_6$. An electric field created in capacitor 25 at time $t_6$ is in the opposite direction from the polarization field of capacitor 25. The electric field depolarizes capacitor 25 and may polarize capacitor 25 in the opposite direction depending on the ratio of the capacitance of capacitor 25 to that of reference bit line capacitor 38. The state of capacitor 25 changes from polarization state 51 to intermediate state 61 of hysteresis loop 50. The voltage across ferroelectric capacitor 25 is equal to the voltage difference between intermediate state 61 and polarization state 51. Likewise, ferroelectric capacitor 26 is placed in polarization state 52 by extraction signal 19A and reset signal 34A at time $t_3$ and remains in polarization state 52 until time $t_6$. An electric field created in capacitor 26 at time $t_6$ is in the same direction as its polarization field. The electric field further polarizes capacitor 26. The state of capacitor 26 changes from polarization state 52 to intermediate state 62 of hysteresis loop 50. The voltage across ferroelectric capacitor 26 is equal to the voltage difference between intermediate state 62 and polarization state 52. Because ferroelectric capacitors 25 and 26 are coupled to capacitor 38 via FETs 21 and 22, which have commonly coupled gate electrodes and drain electrodes, the voltage across ferroelectric capacitor 25 at intermediate state 61 is approximately equal to the voltage across ferroelectric capacitor 26 at intermediate state 62. The voltage across reference bit line capacitor 38 is approximately equal to difference between $V_{DD}$ and the voltage at intermediate state 61. Because ferroelectric capacitors 14, 25, and 26 are identical to each other in size, shape, and in capacitance, and the capacitance of reference bit line capacitor 38 is twice as large as the capacitance of bit line capacitor 18, and the voltage at state 61 is between the voltages at state 53 and 54. In other words, the voltage at reference bit line 37 is lower than the voltage at bit line 17 when data storage element 10 stores a logic "one", and higher than the voltage at bit line 17 when data storage element 10 stores a logic "zero". Therefore, the logic state of ferroelectric capacitor 14 determines the polarity of a potential difference between bit line 17 and reference bit line 37.

At time $t_7$, sense amplifier 42 is activated by sense amplification signal 42A. Sense amplifier 42 senses the potential difference between bit line 17 and reference bit line 37. Further, sense amplifier 42 generates a data value voltage across bit line 17 and reference bit line 37 by amplifying the potential difference. The polarity of the data value voltage is identical to that of the potential difference. Data stored in data storage element 10 is read out by sensing the data value voltage.

When a logic "one" is stored in data storage element 10 before the "read" process starts, ferroelectric capacitor 14 is placed in state 53 at time $t_6$ and the potential at bit line 17 is higher than the potential at reference bit line 37. Sense amplifier 42 raises the potential at bit line 17 to the voltage $V_{DD}$ and lowers the potential at reference bit line 37 to ground. A potential of $V_{DD}$ at bit line 17 results in a logic "one" being read from data storage element 10. The voltage across ferroelectric capacitor 14 is zero. The state of ferroelectric capacitor 14 changes from intermediate state 53 to neutral state 55.

When a logic "zero" is stored in data storage element 10 before the "read" process starts, ferroelectric capacitor 14 is placed in state 54 at time $t_6$ and the potential at bit line 17 is lower than the potential at reference bit line 37. Sense amplifier 42 lowers the potential at bit line 17 to ground and raises the potential at reference bit line 37 to the voltage $V_{DD}$. A ground potential at bit line 17 results in a logic "zero" being read from data storage element 10. The voltage across ferroelectric capacitor 14 is $+V_{DD}$. The state of ferroelectric capacitor 14 changes from intermediate state 54 to saturation state 58.

At time $t_8$, extraction signal 19A and reference extraction signal 39A are lowered to ground. When a logic "one" is stored in data storage element 10 before the "read" process starts, bit line 17 is at the voltage $V_{DD}$ and the voltage across ferroelectric capacitor 14 is the voltage $-V_{DD}$. The state of ferroelectric capacitor 14 changes from neutral state 55 to saturation state 57. When a logic "zero" is stored in data storage element 10 before the "read" process starts, bit line 17 is at ground and the voltage across ferroelectric capacitor 14 is zero. The state of ferroelectric capacitor 14 changes from saturation state 58 to polarization state 52.

At time $t_9$, memory control signal 16A is lowered to ground, switching off FET 12. Further, reference control signal 31A is lowered to ground, switching off FETs 21 and 22. Ferroelectric capacitor 14 is isolated from bit line 17, and ferroelectric capacitors 25 and 26 are isolated from reference bit line 37. When a logic "one" is stored in data storage element 10 before the "read" process starts, the state of ferroelectric capacitor 14 changes from saturation state 57 to polarization state 51 due to the leakage from ferroelectric capacitor 14. Therefore, a logic "one" is restored in data storage element 10. When a logic "zero" is stored in data storage element 10 before the "read" process starts, ferroelectric capacitor 14 remains in polarization state 52. Therefore, a logic "zero" is restored in data storage element 10.

The reading process ends at time $t_{10}$ when sense amplifier 42 is deactivated by sense amplification signal 42A. After time $t_{10}$, a new read command or a write command may be executed to read data from or write data into, respectively, data storage element 10.

It should be understood that, in accordance with the present invention, the timing relations among memory control signal 16A, extraction signal 19A, and reference control signal 31A between times $t_5$ and $t_9$ are not limited to being exactly the same as those of the embodiment shown in timing diagram 80. More particularly, reference control signal 31A is not limited to rising and falling simultaneously with memory control signal 16A. Furthermore, extraction signal 19A may rise before the occurrence of the rising edges of memory control signal 16A and reference control signal 31A.

Figure 4:
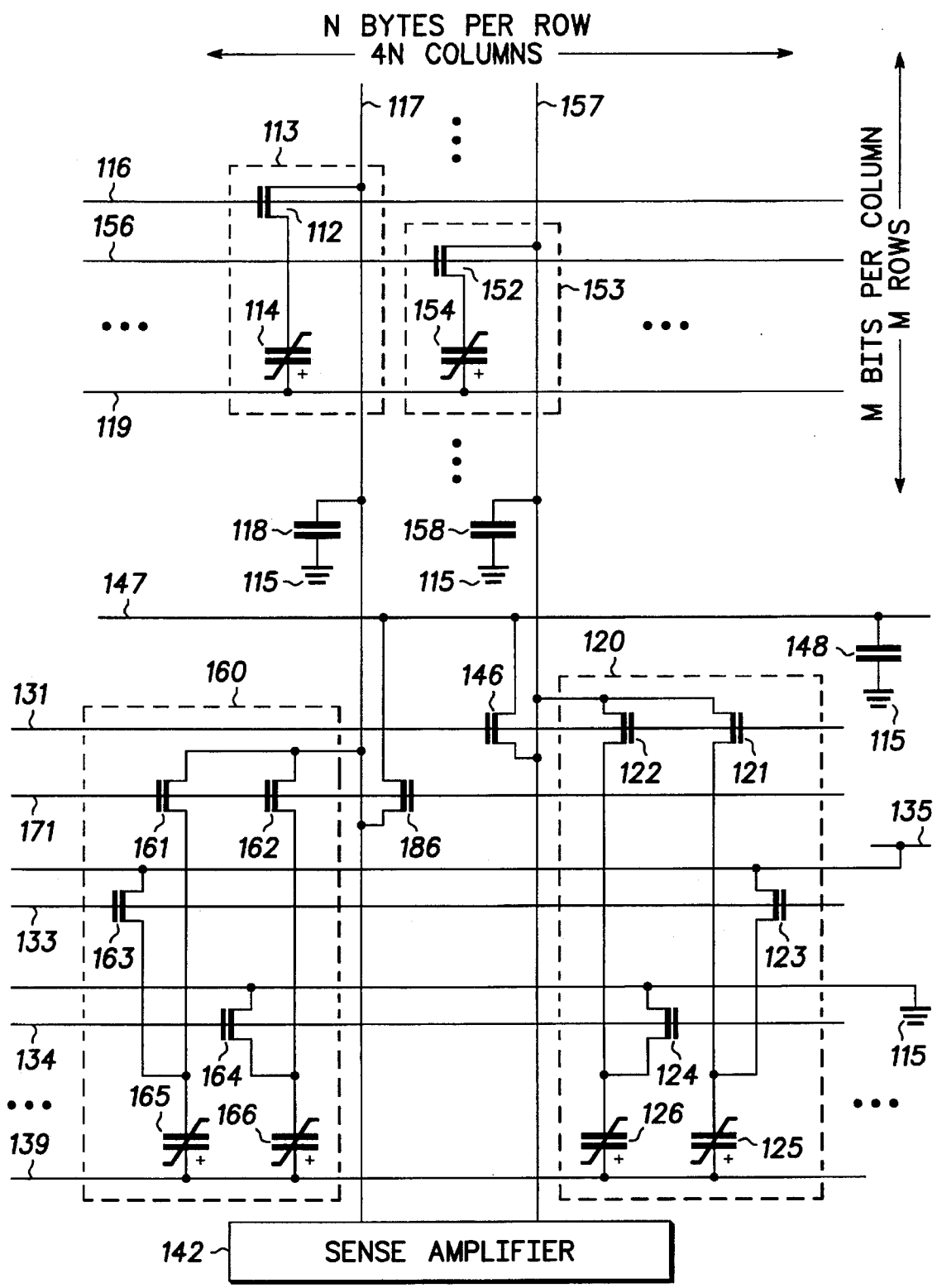
FIG. 4 is a schematic diagram of a non-volatile memory unit in accordance with a second embodiment of the present invention.

FIG. 4 is a schematic diagram of a non-volatile memory unit 110 in accordance with a second embodiment of the present invention. It should be noted that a memory unit is also referred to as a data storage element. By way of example, memory unit 110 stores up to M×N bytes of data, where M and N are integers, and the data is written to or read from memory unit 110 one byte at a time. Memory unit 110 includes memory cells arranged in M rows, wherein each row has two arrays of memory cells and each array has 4N memory cells. In FIG. 4, a memory cell 113 is shown as a representative cell of memory cells in the first array and a memory cell 153 is shown as a representative cell of memory cells in the second array.

Memory cell 113 includes a pass gate FET 112 and a ferroelectric capacitor 114. A gate electrode of FET 112 serves as a control terminal of memory cell 113 and is connected to a word line 116. A drain electrode of FET 112 serves as a data terminal of memory cell 113 and is connected to a bit line 117. A source electrode of FET 112 is connected to a first electrode of ferroelectric capacitor 114. A second electrode of ferroelectric capacitor 114 serves as a cell plate terminal of memory cell 113 and is connected to a plate line 119.

Memory cell 153 includes a pass gate FET 152 and a ferroelectric capacitor 154. A gate electrode of FET 152 serves as a control terminal of memory cell 153 and is connected to a word line 156. A drain electrode of FET 152 serves as a data terminal of memory cell 153 and is connected to a bit line 157. A source electrode of FET 152 is connected to a first electrode of ferroelectric capacitor 154. A second electrode of ferroelectric capacitor 154 serves as a cell plate terminal of memory cell 153 and is connected to plate line 119.

The polarization states of ferroelectric capacitors 114 and 154 determine the logical values of the data stored in memory cells 113 and 153, respectively. The voltage across ferroelectric capacitor 114 or 154 is defined as positive when the potential at the electrode connected to plate line 119, i.e., the electrode identified with a positive sign in FIG. 4, is higher than the potential at the electrode connected to FETs 112 or 152. The polarity of the polarization charge in ferroelectric capacitor 114 or 154 is defined as positive when the charge on the electrode with the positive sign (FIG. 4) is positive.

FETs 112 and 152 serve as pass gates for memory cells 113 and 153, respectively. Although FIG. 4 shows FETs 112 and 152 as insulated gate field effect transistors, this is not a limitation of the present invention. FETs 112 and 152 may be replaced by any type of switch having control electrodes and current conducting electrodes such as, for example, CMOS pass gates, bipolar transistors, MESFETs, or the like.

Bit lines 117 and 157 have the same bit position in two different bytes of data. More particularly, if bit line 117 is activated for writing or reading a logic value at the second bit in a byte of data, bit line 157 is activated for writing or reading a logic value at the second bit in another byte of data.

It should be noted that word line 116 is connected to the control terminals of all memory cells in the first array in a row and word line 156 is connected to the control terminals of all memory cells in the second array in the same row. Thus, there are two word lines for each row of memory cells, i.e., there are 2M word lines in memory unit 110. Bit line 117 is connected to the data terminals of all memory cells in a column that includes memory cell 113. Likewise, bit line 157 is connected to the data terminals of all memory cells in a column that includes memory cell 153. Therefore, there are 8N bit lines in memory unit 110. It should also be noted that parasitic bit line capacitors 118 and 158 are between bit lines 117 and 157, respectively, and a voltage supply conductor 115. By way of example, voltage supply conductor 115 is coupled for receiving a ground potential. Plate line 119 is connected to the cell plate terminals of all memory cells in memory unit 110. In an alternative embodiment, there are M plate lines like plate line 119, each plate line connected to the cell plate terminals of all memory cells in a row.

Memory unit 110 further includes eight reference capacitance lines, each capacitance line corresponding to a bit in a byte of data. A reference capacitance line 147 is shown in FIG. 4 as a representative reference capacitance line. A parasitic capacitor 148 is between reference capacitance line 147 and voltage supply conductor 115. Preferably, the capacitance of capacitor 148 is substantially equal to or slightly larger than the capacitance of a bit line capacitor such as bit line capacitor 118 or 158. Techniques for adjusting the capacitance of parasitic capacitor 148 include adjusting the size and shape of reference capacitance line 147, coupling dummy circuit elements such as, for example, transistors, between reference capacitance line 147 and voltage supply conductor 115, etc. Reference capacitance line 147 is coupled to bit line 157 via a FET 146 and is coupled to bit line 117 via a FET 186. FET 146 has a gate electrode connected to reference word line 131, a source electrode connected to reference capacitance line 147, and a drain electrode connected to bit line 157. FET 186 has a gate electrode connected to reference word line 171, a source electrode connected to reference capacitance line 147, and a drain electrode connected to bit line 117. FETs 146 and 186 serve as coupling switches for coupling reference capacitance line 147 to bit lines 117 and 157. It should be noted that reference capacitance line 147 is coupled via coupling switches to all bit lines which are in the same bit position in a byte of data as bit lines 117 and 157.

Memory unit 110 also includes 4N sense amplifiers, of which a sense amplifier 142 is shown in FIG. 4 as a representative sense amplifier. A first terminal of sense amplifier 142 is connected to bit line 117 and a second terminal of sense amplifier 142 is connected to bit line 157. Sense amplifier 142 is activated during a reading process by a sense amplification signal. It should be noted that, when reading a byte of data from memory unit 110, only the sense amplifier coupled to the bit lines corresponding to a bit in that byte of data is activated. Therefore, the 4N sense amplifiers in memory unit 110 are partitioned into N/2 sets. The eight sense amplifiers in a set share one sense amplification signal and are activated and deactivated simultaneously. Accordingly, there are up to N/2 sense amplification signals and N/2 pull down signals transmitted to memory unit 110 during a reading process.

Memory unit 110 also includes 8N reference cells, each reference cell coupled to a bit line corresponding to a column of memory cells. Reference cells 120 and 160 are shown in FIG. 4 as two representative reference cells.

Reference cell 120 includes FETs 121, 122, 123, 124, and ferroelectric capacitors 125 and 126. A gate electrode of FET 121 and a gate electrode of FET 122 are connected together to form a control terminal of reference cell 120. Further, the gate electrodes of FETs 121 and 122 are connected to a reference word line 131. A drain electrode of FET 121 and a drain electrode of FET 122 are connected together to form a reference terminal of reference cell 120. Further, the drain electrodes of FETs 121 and 122 are connected to bit line 157. A source electrode of FET 121 is connected to a source electrode of FET 123 and to a first electrode of ferroelectric capacitor 125. A gate electrode of FET 123 is connected to a reset line 133 and serves as a first reset terminal of reference cell 120. A drain electrode of FET 123 is connected to a voltage supply conductor 135 and serves as a first voltage terminal of reference cell 120. By way of example, voltage supply conductor 135 is coupled for receiving a voltage of, for example, $V_{DD}$. A source electrode of FET 122 is connected to a source electrode of FET 124 and to a first electrode of ferroelectric capacitor 126. A gate electrode of FET 124 is connected to a reset line 134 and serves as a second reset terminal of reference cell 120. A drain electrode of FET 124 is connected to voltage supply conductor 115 and serves as a second voltage terminal of reference cell 120. A second electrode of ferroelectric capacitor 125 and a second electrode of ferroelectric capacitor 126 are connected together to form a cell plate terminal of reference cell 120. The cell plate terminal of reference cell 120 is connected to a reference plate line 139 for receiving a reference extraction signal.

Reference cell 160 includes FETs 161, 162, 163, 164, and ferroelectric capacitors 165 and 166. A gate electrode of FET 161 and a gate electrode of FET 162 are connected together to form a control terminal of reference cell 160. The control terminal of reference cell 160 is connected to a reference word line 171. A drain electrode of FET 161 and a drain electrode of FET 162 are connected together to form a reference terminal of reference cell 160. The reference terminal of reference cell 160 is connected to bit line 117. A gate electrode of FET 163 is connected to reset line 133 and serves as a first reset terminal of reference cell 160. A drain electrode of FET 163 is connected to voltage supply conductor 135 and serves as a first voltage terminal of reference cell 160. A gate electrode of FET 164 is connected to reset line 134 and serves as a second reset terminal of reference cell 160. A drain electrode of FET 164 is connected to voltage supply conductor 115 and serves as a second voltage terminal of reference cell 160. A first electrode of ferroelectric capacitor 165 is connected to a source electrode of FET 161 and to a source electrode of FET 163. A first electrode of ferroelectric capacitor 166 is connected to a source electrode of FET 162 and to a source electrode of FET 164. A second electrode of ferroelectric capacitor 165 and a second electrode of ferroelectric capacitor 166 are connected together to form a cell plate terminal of reference cell 160. The cell plate terminal of reference cell 160 is connected to reference plate line 139.

It should be noted that reference word line 131 is connected to the control terminals of all reference cells coupled to a bit line corresponding to a memory cell which is in the same byte of data as memory cell 153. Further, reference word line 171 is connected to the control terminals of all reference cells coupled to a bit line corresponding to a memory cell which is in the same byte of data as memory cell 113. Thus, there are N reference word lines corresponding to memory unit 110 storing up to N bytes of data in a row of memory cells. Reset lines 133 and 134 are connected to the first and second reset terminals, respectively, of all reference cells in memory unit 110. Voltage supply conductors 135 and 115 are connected to the first and second voltage terminals, respectively, of all reference cells in memory unit 110. Reference plate line 139 is connected to the cell plate terminals of all reference cells in memory unit 110.

Ferroelectric capacitors 125 and 126 are reference capacitors for providing a reference voltage when reading data from a memory cell in a column that includes memory cell 113. Similarly, ferroelectric capacitors 165 and 166 are reference capacitors for providing a reference voltage when reading data from a memory cell in a column that includes memory cell 153. The voltage across ferroelectric capacitors 125, 126, 165, or 166 is defined as positive when the potential at the electrode of the corresponding capacitor connected to reference plate line 139, i.e. the electrode identified with a positive sign in FIG. 4, is higher than the potential at the electrode connected to the respective FET 123, 124, 163, or 164. The polarity of the polarization charge in the ferroelectric capacitors 125, 126, 165, or 166 is defined as positive when the charge on the electrode of the corresponding capacitor with the positive sign is positive. Preferably, ferroelectric capacitors 114, 125, 126, 154, 165, and 166 are fabricated using the same process. Further, the sizes and shapes of ferroelectric capacitors 114, 154, 125, 126, 165, and 166 are preferably identical to each other. Thus, the capacitances of the ferroelectric capacitors in reference cells 120 and 160 track the capacitances of the ferroelectric capacitors in memory cells 113 and 153.

FETs 121, 122, 123, 124, and FETs 161, 162, 163, 164 serve as switches in reference cells 120 and 160, respectively. Although FIG. 4 shows FETs 121, 122, 123, 124, 161, 162, 163, and 164 as n-channel insulated gate field effect transistors, this is not a limitation of the present invention. FETs 121, 122, 123, 124, 161, 162, 163, and 164 may be replaced by any type of switch having control electrodes and current conducting electrodes such as, for example, CMOS pass gates, bipolar transistors, MESFETs, or the like.

It should be understood that data in a memory unit like memory unit 110 is not limited to being accessed one byte at a time and that the number of reference capacitance lines like reference capacitance line 147 is not limited to being eight. In accordance with the present invention, data in a memory unit like memory unit 110 is accessed one block at a time, wherein a block may include any number of bits of data. The number of reference capacitance lines, e.g., reference capacitance line 147, is preferably equal to the number of bits in a block of data and the number of reference word lines like reference word lines 131 and 171 is preferably equal to the number of blocks of data in a row of memory unitl 110. Further, the sense amplifiers like sense amplifier 142 are partitioned into a number of sets, wherein the number of sense amplifiers in each set is preferably equal to the number of bits in a block of data and the number of sets is preferably equal to one half of the number of blocks of data in a row.

In order to write data into and read data from memory unit 110, each word line, like word line 116 or 156, is coupled for receiving a memory control signal, which is also referred to as a word line signal. Furthermore, each reference word line, like reference word line 131 or 171, is coupled for receiving a reference control signal. Therefore, there are 2M memory control signals and N reference control signals applied to memory unit 110. Plate line 119 is coupled for receiving an extraction signal, which is also referred to as a plate line signal. Reset lines 133 and 134 are coupled for receiving first and second reset signals. Reference plate line 139 is coupled for receiving a reference extraction signal, which is also referred to as a reference plate line signal. In addition there are N/2 sense amplification signals and N/2 pull down signal applied to the sense amplifiers like sense amplifier 142.

During the process of reading a byte of data that includes a bit of data stored in memory cell 113, the memory control signal applied to word line 116, the extraction signal applied to plate line 119, the reference control signal applied to reference word line 131, the reset signals applied to reset lines 133 and 134, the reference extraction signal applied to reference plate line 139, and the sense amplification signal and the pull down signal applied to sense amplifier 142 are activated in an order analogous to that of memory control signal 16A, extraction signal 19A, reference control signal 31A, reset signals 33A and 34A, reference extraction Signal 39A, sense amplification signal 42A, and pull down signal 44A, respectively, as shown and described with reference to timing diagram 80 of FIG. 3. The operation of memory unit 110 to read data from memory cell 113 is analogous to that of data storage element 10 of FIG. 1, wherein memory cell 113 corresponds to memory cell 13, bit line 117 corresponds to bit line 17, and bit line 157 corresponds to reference bit line 37. Ferroelectric capacitors 125 and 126 are coupled to bit line 157 via FETs 121 and 122, respectively, and correspond to ferroelectric capacitors 25 and 26, respectively, of data storage element 10. Further, capacitor 148 is coupled to bit line 157 via conductive FET 146 and cooperates with capacitor 158 to perform a function analogous to reference bit line capacitor 38 of data storage element 10.

During the process of reading a byte of data that includes a bit of data stored in memory cell 153, the memory control signal applied to word line 156, the extraction signal applied to plate line 119, the reference control signal applied to reference word line 171, the reset signals applied to reset lines 133 and 134, the reference extraction signal applied to reference plate line 139, and the sense amplification signal and the pull down signal applied to sense amplifier 142 are activated in an order analogous to that of memory control signal 16A, extraction signal 19A, reference control signal 31A, reset signals 33A and 34A, reference extraction signal 39A, sense amplification signal 42A, and pull down signal 44A, respectively, as shown in timing diagram 80 of FIG. 3. The operation of memory unit 110 to read data from memory cell 153 is analogous to that of data storage element 10 of FIG. 1, wherein memory cell 153 corresponds to memory cell 13, bit line 157 corresponds to bit line 17, and bit line 117 corresponds to reference bit line 37. Ferroelectric capacitors 165 and 166 are coupled to bit line 117 via FETs 161 and 162, respectively, and correspond to ferroelectric capacitors 25 and 26, respectively, of data storage element 10. Further, capacitor 148 is coupled to bit line 117 via conductive FET 186 and cooperates with capacitor 158 to perform a function analogous to reference bit line capacitor 38 of data storage element 10.

Figure 5:
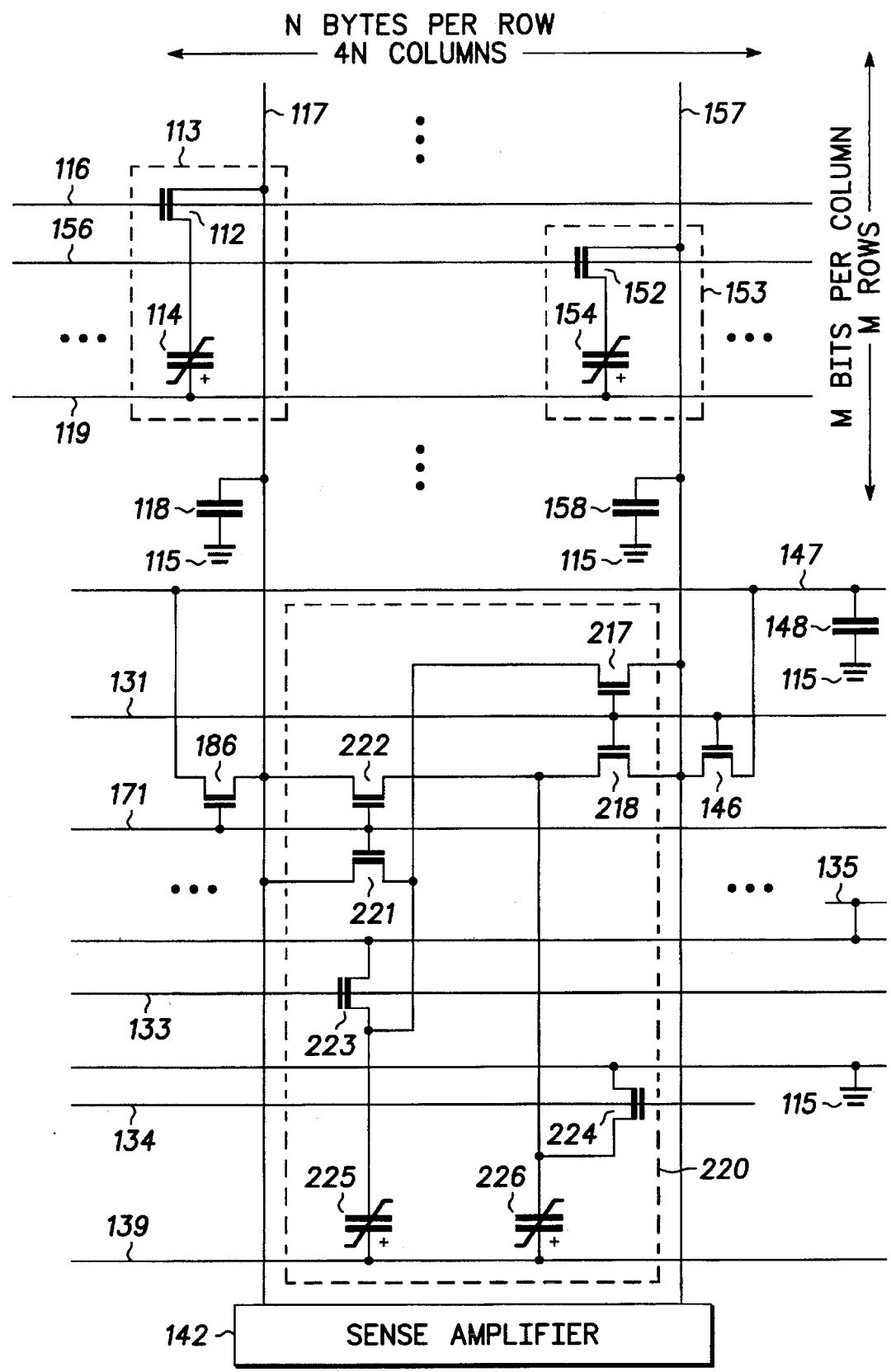
FIG. 5 is a schematic diagram of a non-volatile memory unit in accordance with a third embodiment of the present invention.

FIG. 5 is a schematic diagram of a non-volatile memory unit 210 in accordance with a third embodiment of the present invention. By way of example, memory unit 210 stores data up to M×N bytes, where M and N are integers, and the data is written to or read from memory unit 210 one byte at a time. Memory unit 210 includes memory cells arranged in M rows, wherein each row has two arrays of memory cells and each array has 4N memory cells. Like memory unit 110 shown in FIG. 4, memory unit 210 includes 2M word lines, a plate line, 8N bit lines, eight reference capacitance lines, and 4N sense amplifiers partitioned into N/2 sets. The structures of memory cells, word lines, plate line, bit lines, reference capacitance lines and sense amplifiers are identical to those of memory unit 110 shown in FIG. 4. It should be understood that the same reference numerals are used in the figures to denote the same elements.

Memory unit 210 also includes 4N reference cells, each reference cell coupled to two bit lines. Reference cell 220 is shown in FIG. 5 as a representative reference cell. Reference cell 220 includes FETs 217, 218, 221, 222, 223, and 224, and ferroelectric capacitors 225 and 226. A gate electrode of FET 217 and a gate electrode of FET 218 are connected together to form a first control terminal of reference cell 220. The first control terminal of reference cell 220 is connected to a first reference word line 131. A drain electrode of FET 217 and a drain electrode of FET 218 are connected together to form a first reference terminal of reference cell 220. The first reference terminal of reference cell 220 is connected to bit line 157. A source electrode of FET 217 is connected to a source electrode of FET 223 and to a first electrode of ferroelectric capacitor 225. A source electrode of FET 218 is connected to a source electrode of FET 224 and to a first electrode of ferroelectric capacitor 226. A gate electrode of FET 221 and a gate electrode of FET 222 are connected together to form a second control terminal of reference cell 220. The second control terminal of reference cell 220 is connected to a second reference word line 171. A drain electrode of FET 221 and a drain electrode of FET 222 are connected together to form a second reference terminal of reference cell 220. The second reference terminal of reference cell 220 is connected to bit line 117. A source electrode of FET 221 is connected to the source electrode of FET 217. A source electrode of FET 222 is connected to the source electrode of FET 218. A gate electrode of FET 223 is connected to a reset line 133 and serves as a first reset terminal of reference cell 220. A drain electrode of FET 223 is connected to voltage supply conductor 135 and serves as a first voltage terminal of reference cell 220. Voltage supply conductor 135 is coupled for receiving a potential of, for example, $V_{DD}$. A gate electrode of FET 224 is connected to a reset line 134 and serves as a second reset terminal of reference cell 220. A drain electrode of FET 224 is connected to voltage supply conductor 115 and serves as a second voltage terminal of reference cell 220. By way of example, voltage supply conductor 115 is coupled for receiving a ground potential. A second electrode of ferroelectric capacitor 225 and a second electrode of ferroelectric capacitor 226 are connected together to form a cell plate terminal of reference cell 220. The cell plate terminal of reference cell 220 is connected to a reference plate line 139.

It should be noted that reference word lines 131 and 171 are connected to the first and second control terminals, respectively, of all reference cells coupled to bit lines corresponding to memory cells which are in the same byte of data as memory cell 153 or memory cell 113. Thus, there are N reference word lines corresponding to memory unit 210 storing up to N bytes of data in a row of memory cells. Reset lines 133 and 134 are connected to the first and second reset terminals, respectively, of all reference cells in memory unit 210. Voltage supply conductors 135 and 115 are connected to the first and second voltage terminals, respectively, of all reference cells in memory unit 210. Reference plate line 139 is connected to the cell plate terminals of all reference cells in memory unit 210.

Ferroelectric capacitors 225 and 226 are reference capacitors for providing reference voltage when reading data from a memory cell in the column that includes either memory cell 113 or memory cell 153. The voltage across ferroelectric capacitor 225 or 226 is defined as positive when the potential at the electrode of the corresponding capacitor connected to reference plate 139, i.e., the electrode identified with a positive sign in FIG. 5 is higher than the potential at the electrode connected to the respective FETs 223 or 224. The polarity of the polarization charge in ferroelectric capacitor 225 or 226 is defined as positive when the charge on the electrode of the corresponding capacitor with the positive sign (FIG. 5) is positive. Preferably, ferroelectric capacitors 114, 154, 225, and 226 are fabricated using the same process. Further, the sizes and shapes of ferroelectric capacitors 114, 154, 225, and 226 are preferably identical to each other. Thus, the capacitances of the ferroelectric capacitors in reference cell 220 track the capacitances of the ferroelectric capacitors in memory cells 113 and 153.

FETs 217, 218, 221, 222, 223, and 224 serve as switches in reference cell 220. Although FIG. 5 shows FETs 217, 218, 221, 222, 223, and 224 as n-channel insulated gate field effect transistors, this is not a limitation of the present invention. FETs 217, 218, 221, 222, 223, and 224 may be replaced by any type of switch having control electrodes and current conducting electrodes such as, for example, CMOS pass gates, bipolar transistors, MESFETs, or the like.

It should be understood that data in a memory unit like memory unit 210 is not limited to being accessed one byte at a time and that the number of reference capacitance lines like reference capacitance line 147 is not limited to being eight. In accordance with the present invention, data in a memory unit like memory unit 210 is accessed one block at a time, wherein a block may include any number of bits of data. The number of reference capacitance lines, e.g., reference capacitance line 147, is preferably equal to the number of bits in a block of data and the number of reference word lines like reference word lines 131 and 171 is preferably equal to the number of blocks of data in a row of memory unit 210. Further, the sense amplifiers like sense amplifier 142 are partitioned into a number of sets, wherein the number of sense amplifiers in each set is preferably equal to the number of bits in a block of data and the number of sets is preferably equal to one half of the number of blocks of data in a row.

In order to write data into and read data from memory unit 210, the word lines, plate line, reference word lines, reset lines, reference plate line and sense amplifiers are coupled for receiving their respective signals like memory unit 110 shown in FIG. 4. As described hereinbefore, data is read from memory unit 210 one byte at a time.

During the process of reading a byte of data that includes a bit of data stored in memory cell 113, the memory control signal applied to word line 116, the extraction signal applied to plate line 119, the reference control signal applied to reference word line 131, the reset signals applied to reset lines 133 and 134, the reference extraction signal applied to reference plate line 139, and the sense amplification signal and the pull down signal applied to sense amplifier 142 are activated in an order analogous to that of memory control signal 16A, extraction signal 19A, reference control signal 31A, reset signals 33A and 34A, reference extraction signal 39A, sense amplification signal 42A, and pull down signal 44A, respectively, as shown in timing diagram 80 of FIG. 3. The operation of memory unit 210 to read data for memory cell 113 is analogous to that of data storage element 10 of FIG. 1, wherein memory cell 113 corresponds to memory cell 13, bit line 117 corresponds to bit line 17, and bit line 157 corresponds to reference bit line 37. Ferroelectric capacitors 225 and 226 are coupled to bit line 157 via FETs 217 and 218, respectively, and correspond to ferroelectric capacitors 25 and 26, respectively, of data storage element 10. Further, capacitor 148 is coupled to bit line 157 via conductive FET 146 and cooperates with capacitor 158 to perform a function analogous to reference bit line capacitor 38 of data storage element 10.

During the process of reading a byte of data that includes a bit of data stored in memory cell 153, the memory control signal applied to word line 156, the extraction signal applied to plate line 119, the reference control signal applied to reference word line 171, the reset signals applied to reset lines 133 and 134, the reference extraction signal applied to reference plate line 139, and the sense amplification signal and the pull down signal applied to sense amplifier 142 are activated in an order analogous to that of memory control signal 16A, extraction signal 19A, reference control signal 31A, reset signals 33A and 34A, reference extraction signal 39A, sense amplification signal 42A, and pull down signal 44A, respectively, as shown in timing diagram 80 of FIG. 3. The operation of memory unit 210 to read data from memory cell 153 is analogous to that of data storage element 10 of FIG. 1, wherein memory cell 153 corresponds to memory cell 13, bit line 157 corresponds to bit line 17, and bit line 117 corresponds to reference bit line 37. Ferroelectric capacitors 225 and 226 are coupled to bit line 117 via FETs 221 and 222, respectively, and correspond to ferroelectric capacitors 25 and 26, respectively, of data storage element 10. Further, capacitor 148 is coupled to bit line 117 via conductive FET 186 and cooperates with capacitor 118 to perform a function analogous to reference bit line capacitor 38 of data storage element 10.

Figure 6:
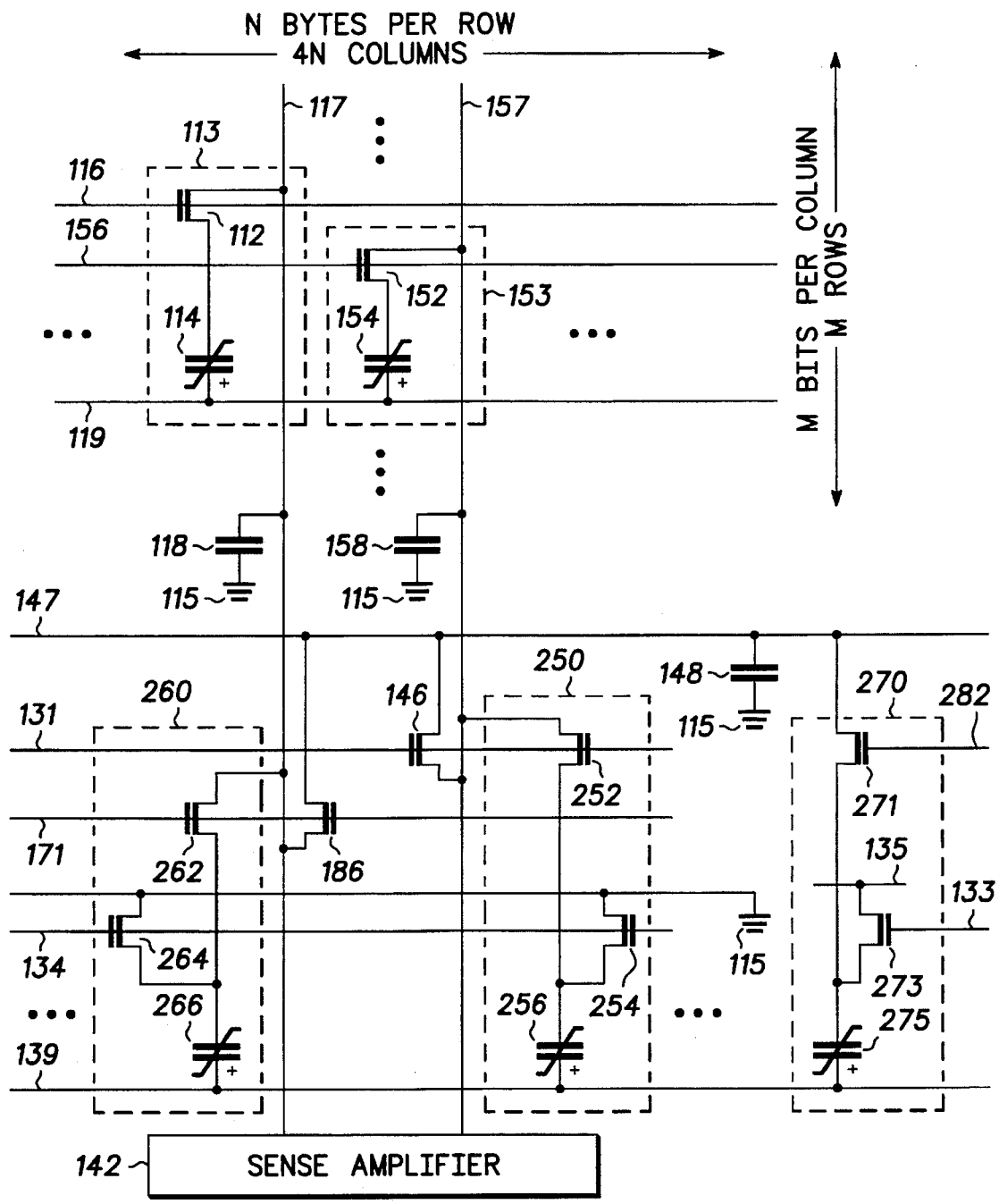
FIG. 6 is a schematic diagram of a non-volatile memory unit in accordance with a fourth embodiment of the present invention.

FIG. 6 is a schematic diagram of a non-volatile memory unit 240 in accordance with a fourth embodiment of the present invention. By way of example, memory unit 240 stores up to M×N bytes of data, where M and N are integers, and the data is written to or read from memory unit 240 one byte at a time. Memory unit 240 includes memory cells arranged in M rows, wherein each row has two arrays of memory cells and each array has 4N memory cells. Like memory unit 110 shown in FIG. 4 and memory unit 210 shown in FIG. 5, memory unit 240 includes 2M word lines, a plate line, 8N bit lines, eight reference capacitance lines, and 4N sense amplifiers partitioned into N/2 sets. The structures of memory cells, word lines, plate line, bit lines, reference capacitance lines, and sense amplifiers are identical to those of memory unit 110 shown in FIG. 4. It should be understood that the same reference numerals are used in the figures to denote the same elements.

Memory unit 240 also includes 8N bit line reference cells, each bit line reference cell coupled to a bit line corresponding to a column of memory cells. Reference cells 250 and 260 are shown in FIG. 6 as two representative bit line reference cells.

Reference cell 250 includes FETs 252 and 254, and a ferroelectric capacitor 256. A gate electrode of FET 252 is connected to a reference word line 131 and serves as a control terminal of reference cell 250. A drain electrode of FET 252 is connected to bit line 157 and serves as a reference terminal of reference cell 250. A source electrode of FET 252 is connected to a source electrode of FET 254 and to a first electrode of ferroelectric capacitor 256. A gate electrode of FET 254 is connected to a reset line 134 and serves as a reset terminal of reference cell 250. A drain electrode of FET 254 is connected to voltage supply conductor 115 and serves as a voltage terminal of reference cell 250. By way of example, voltage supply conductor is coupled for receiving a ground potential. A second electrode of ferroelectric capacitor 256 is connected to a reference plate line 139 and serves as a cell plate terminal of reference cell 250.

Reference cell 260 includes FETs 262 and 264, and a ferroelectric capacitor 266. A gate electrode of FET 262 is connected to a reference word line 171 and serves as a control terminal of reference cell 260. A drain electrode of FET 262 is connected to bit line 117 and serves as a reference terminal of reference cell 260. A gate electrode of FET 264 is connected to reset line 134 and serves as reset terminal of reference cell 160. A drain electrode of FET 264 is connected to voltage supply conductor 115 and serves as a voltage terminal of reference cell 260. A first electrode of ferroelectric capacitor 266 is connected to a source electrode of FET 262 and to a source electrode of FET 264. A second electrode of ferroelectric capacitor 266 is connected to reference plate line 139 and serves as a cell plate terminal of reference cell 260.

It should be noted that reference word line 131 is connected to the control terminals of all bit line reference cells coupled to a bit line corresponding to a memory cell which is in the same byte of data as memory cell 153. Further, reference word line 171 is connected to the control terminals of all bit line reference cells coupled to a bit line corresponding to a memory cell which is in the same byte of data as memory cell 113. Thus, there are N reference word lines corresponding to memory unit 240 storing up to N bytes of data in a row of memory cells. Reset line 134 is connected to the reset terminals of all bit line reference cells in memory unit 240. Voltage supply conductor 115 is connected to the voltage terminals of all bit line reference cells in memory unit 240. Reference plate line 139 is connected to the cell plate terminals of all bit line reference cells in memory unit 240.

Memory unit 240 further includes eight capacitance line reference cells, each capacitance line reference cell coupled to a reference capacitance line. Reference cell 270 is shown in FIG. 6 as a representative capacitance line reference cell. Reference cell 270 includes FETs 271 and 273 and a ferroelectric capacitor 275. FET 271 has a gate electrode connected to an activation line 282, a drain electrode connected to reference capacitance line 147, and a source electrode connected to a source electrode of FET 273 and to a first electrode of ferroelectric capacitor 275. A gate electrode of FET 273 is connected to reset line 133. A drain electrode of FET 273 is connected to voltage supply conductor 135. Voltage supply conductor 135 is coupled for receiving a voltage such as, for example, $V_{DD}$. A second electrode of ferroelectric capacitor 275 is connected to reference plate line 139.

Ferroelectric capacitors 256, 266, and 275 are reference capacitors for providing a reference voltage when reading data from memory unit 240. When reading data from memory cell 113, ferroelectric capacitors 256 and 275 cooperate to provide the reference voltage at bit line 157. Similarly, when reading data from memory cell 153, ferroelectric capacitors 266 and 275 cooperate to provide the reference voltage at bit line 117. The voltage across ferroelectric capacitor 256, 266, or 275 is defined as positive when the potential at the electrode of the corresponding capacitor connected to reference plate line 139, i.e., the electrode identified with a positive sign in FIG. 6, is higher than the potential at the electrode connected to the respective FETs 254, 264, or 273. The polarity of the polarization charge in ferroelectric capacitors 256, 266, and 275 is defined as positive when the charge on the electrode of the corresponding capacitor with the positive sign (FIG. 6) is positive. Preferably, ferroelectric capacitors 114, 154, 256, 266, and 275 are fabricated using the same process. Further, the sizes and shapes of the ferroelectric capacitors 114, 154, 256, 266, and 275 are preferably identical to each other. Thus, the capacitances of ferroelectric capacitors 256, 266, and 275 track the capacitances of ferroelectric capacitors 114 and 154.

FETs 252, 254, 262, 264, 271, and 273 serve as switches. Although FIG. 6 shows FETs 252, 254, 262, 264, 271, and 273 as n-channel insulated gate field effect transistors, this is not a limitation of the present invention. FETs 252, 254, 262, 264, 271, and 273 may be replaced by any type of switch having control electrodes and current conducting electrodes such as, for example, CMOS pass gates, bipolar transistors, MESFETs, or the like.

It should be understood that data in a memory unit like memory unit 240 is not limited to being accessed one byte at a time and that the number of reference capacitance lines like reference capacitance line 147 is not limited to being eight. In accordance with the present invention, data in a memory unit like memory unit 240 is accessed one block at a time, wherein a block may include any number of bits of data. The number of reference capacitance lines, e.g., reference capacitance line 147, is preferably equal to the number of bits in a block of data and the number of reference word lines like reference word lines 131 and 171 is preferably equal to the number of blocks of data in a row of memory unit 240. Further, the sense amplifiers like sense amplifier 142 are partitioned into a number of sets, wherein the number of sense amplifiers in each set is preferably equal to the number of bits in a block of data and the number of sets is preferably equal to one half of the number of blocks of data in a row.

In order to write data into and read data from memory unit 240, the word lines, plate line, reference word lines, reset lines, reference plate line and sense amplifiers are coupled for receiving their respective signals like memory unit 110 shown in FIG. 4. Furthermore, activation line 282 is coupled for receiving an activation signal. The activation signal applied to activation line 282 is at a high voltage level when the voltage at any reference word line is at the high voltage level, and is at a low voltage level when the voltages at all reference word lines in memory unit 240 are at a low voltage level. As described hereinbefore, data is read from memory unit 240 one byte at a time.

During the process of reading a byte of data that includes a bit of data stored in memory cell 113, the memory control signal applied to word line 116, the extraction signal applied to plate line 119, the reference control signal applied to reference word line 131, the reset signals applied to reset lines 133 and 134, the reference extraction signal applied to reference plate line 139, and the sense amplification signal and the pull down signal applied to sense amplifier 142 are activated in an order analogous to that of memory control signal 16A, extraction signal 19A, reference control signal 31A, reset signals 33A and 34A, reference extraction signal 39A, sense amplification signal 42A, and pull down signal 44A, respectively, as shown and described with reference to timing diagram 80 of FIG. 3. The operation of memory unit 240 to read data from memory cell 113 is analogous to that of data storage element 10 of FIG. 1, wherein memory cell 113 corresponds to memory cell 13, bit line 117 corresponds to bit line 17, and bit line 157 corresponds to reference bit line 37. Ferroelectric capacitor 256 is coupled to bit line 157 via FET 252. Ferroelectric capacitor 275 is coupled to bit line 157 via FETs 271 and 146. Ferroelectric capacitors 256 and 275 correspond to ferroelectric capacitors 25 and 26, respectively, of data storage element 10 (FIG. 1). Further, capacitor 148 is coupled to bit line 157 via conductive FET 146 and cooperates with capacitor 158 to perform a function analogous to reference bit line capacitor 38 of data storage element 10.

During the process of reading a byte of data that includes a bit of data stored in memory cell 153, the memory control signal applied to word line 156, the extraction signal applied to plate line 119, the reference control signal applied to reference word line 171, the reset signals applied to reset lines 133 and 134, the reference extraction signal applied to reference plate line 139, and the sense amplification signal and the pull down signal applied to sense amplifier 142 are activated in an order analogous to that of memory control signal 16A, extraction signal 19A, reference control signal 31A, reset signals 33A and 34A, reference extraction signal 39A, sense amplification signal 42A, and pull down signal 44A, respectively, as shown in timing diagram 80 of FIG. 3. The operation of memory unit 240 to read data for memory cell 153 is analogous to that of data storage element 10 of FIG. 1, wherein memory cell 153 corresponds to memory cell 13, bit line 157 corresponds to bit line 17, and bit line 117 corresponds to reference bit line 37. Ferroelectric capacitor 266 is coupled to bit line 117 via FET 262. Ferroelectric capacitor 275 is coupled to bit line 117 via FETs 271 and 186. Ferroelectric capacitors 266 and 275 correspond to ferroelectric capacitors 25 and 26, respectively, of data storage element 10. Further, capacitor 148 is coupled to bit line 117 via conductive FET 186 and cooperates with capacitor 118 to perform a function analogous to reference bit line capacitor 38 of data storage element 10.

Figure 7:
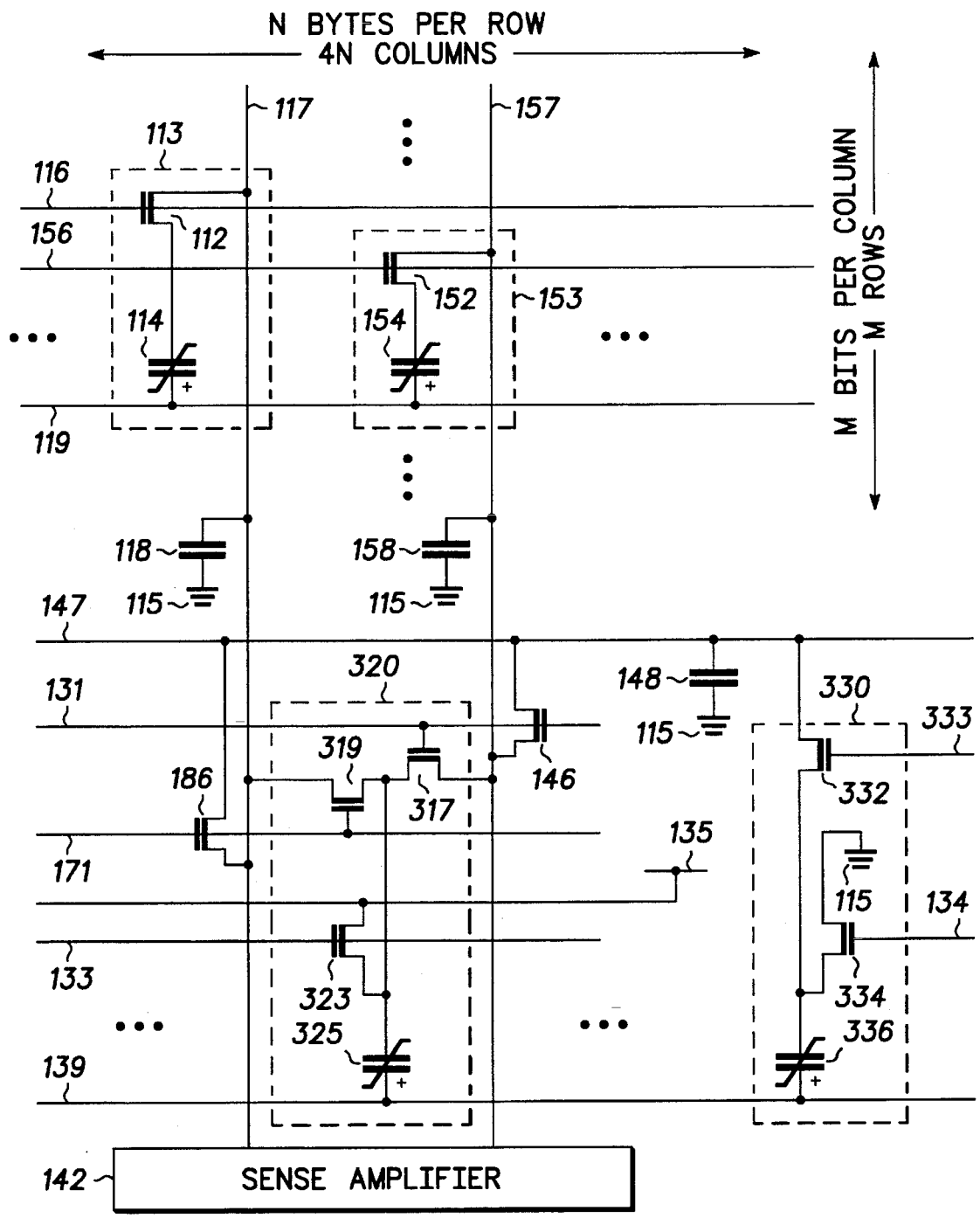
FIG. 7 is a schematic diagram of a non-volatile memory unit in accordance with a fifth embodiment of the present invention.

FIG. 7 is a schematic diagram of a non-volatile memory unit 310 in accordance with a fifth embodiment of the present invention. By way of example, memory unit 310 stores up to M×N bytes of data, where M and N are integers, and the data is written to or read from memory unit 310 one byte at a time. Memory unit 310 includes memory cells arranged in M rows, wherein each row has two arrays of memory cells and each array has 4N memory cells. Like memory unit 110 shown in FIG. 4, memory unit 210 shown in FIG. 5, and memory unit 240 shown in FIG. 6, memory unit 310 includes 2M word lines, a plate line, 8N bit lines, eight reference capacitance lines, and 4N sense amplifiers partitioned into N/2 sets. The structures of memory cells, word lines, plate line, bit lines, reference capacitance lines and sense amplifiers are identical to those of memory unit 110 shown in FIG. 4. It should be understood that the same reference numerals are used in the figures to denote the same elements.

Memory unit 310 also includes 4N bit line reference cells, each bit line reference cell coupled to two bit lines. Reference cell 320 is shown in FIG. 7 as a representative bit line reference cell. Reference cell 320 includes FETs 317, 319, and 323, and a ferroelectric capacitor 325. A gate electrode of FET 317 is connected to reference word line 131 and serves as a first control terminal of reference cell 320. A drain electrode of FET 317 is connected to bit line 157 and serves as a first reference terminal of reference cell 320. A source electrode of FET 317 is connected to a source electrode of FET 323 and to a first electrode of ferroelectric capacitor 325. A gate electrode of FET 319 is connected to reference word line 171 and serves as a second control terminal of reference cell 320. A drain electrode of FET 319 is connected to bit line 117 and serves as a second reference terminal of reference cell 320. A source electrode of FET 319 is connected to the source electrode of FET 317. A gate electrode of FET 323 is connected to reset line 133 and serves as a reset terminal of reference cell 320. A drain electrode of FET 323 is connected to voltage supply conductor 135 and serves as a voltage terminal of reference cell 320. Voltage supply conductor 135 is coupled for receiving a voltage such as, for example, $V_{DD}$. A second electrode of ferroelectric capacitor 325 is connected to a reference plate line 139 and serves as a cell plate terminal of reference cell 320.

It should be noted that reference word lines 131 and 171 are connected to the first and second control terminals, respectively, of all bit line reference cells coupled to a bit line corresponding to a memory cell which is in the same byte of data as either memory cell 113 or memory cell 153. Thus, there are N reference word lines corresponding to memory unit 310 storing up to N bytes of data in a row of memory cells. Reset line 133 is connected to the reset terminals of all bit line reference cells in memory unit 310. Voltage supply conductor 135 is connected to the voltage terminals of all bit line reference cells in memory unit 310. Reference plate line 139 is connected to the cell plate terminals of all bit line reference cells in memory unit 310.

Memory unit 310 further includes eight capacitance line reference cells, each capacitance line reference cell coupled to a reference capacitance line. Reference cell 330 is shown in FIG. 7 as a representative capacitance line reference cell. Reference cell 330 includes FETs 332 and 334, and a ferroelectric capacitor 336. FET 332 has a gate electrode connected to an activation line 333, a drain electrode connected to reference capacitance line 147, and a source electrode connected to a source electrode of FET 334 and to a first electrode of ferroelectric capacitor 336. A gate electrode of FET 334 is connected to reset line 134. A drain electrode of FET 334 is connected to voltage supply conductor 115. By way of example, voltage supply conductor 115 is coupled for receiving a ground potential. A second electrode of ferroelectric capacitor 336 is connected to reference plate line 139.

Ferroelectric capacitors 325 and 336 are reference capacitors for providing reference voltage when reading data from memory unit 310. The Voltage across ferroelectric capacitors 325 and 336 is defined as positive when the potential at the electrode of the corresponding capacitor connected to reference plate line 139, i.e., the electrode identified with a positive sign in FIG. 7, is higher than the potential at the electrode connected to the respective FET 323 or 334. The polarity of the polarization charge in ferroelectric capacitors 325 and 336 is defined as positive when the charge on the electrode of the corresponding capacitor with the positive sign is positive. Preferably, ferroelectric capacitors 114, 154, 325, and 336 are fabricated using the same process. Further, the sizes and shapes of the ferroelectric capacitors 114, 154, 325, and 336 are preferably identical to each other. Thus, the capacitances of ferroelectric capacitors 325 and 336 track the capacitances of ferroelectric capacitors 114 and 154.

FETs 317, 319, 323, 332, and 334 serve as switches. Although FIG. 7 shows FETs 317, 319, 323, 332, and 334 as n-channel insulated gate field effect transistors, this is not a limitation of the present invention. FETs 317, 319, 323, 332, and 334 may be replaced by any type of switch having control electrodes and current conducting electrodes such as, for example, CMOS pass gates, bipolar transistors, MESFETs, or the like.

It should be understood that data in a memory unit like memory unit 310 is not limited to being accessed one byte at a time and that the number of reference capacitance lines like reference capacitance line 147 is not limited to being eight. In accordance with the present invention, data in a memory unit like memory unit 310 is accessed one block at a time, wherein a block may include any number of bits of data. The number of reference capacitance lines, e.g., reference capacitance line 147, is preferably equal to the number of bits in a block of data. Similarly, the number of reference word lines like reference word lines 131 and 171 is preferably equal to the number of blocks of data in a row of memory unit 310. Further, the sense amplifiers like sense amplifier 142 are partitioned into a number of sets, wherein the number of sense amplifiers in each set is preferably equal to the number of bits in a block of data and the number of sets is preferably equal to one half of the number of blocks of data in a row.

In order to write data into and read data from memory unit 310, the word lines, plate line, reference word lines, reset lines, reference plate line and sense amplifiers are coupled for receiving their respective signals like memory unit 110 shown in FIG. 4. Furthermore, activation line 333 is coupled for receiving an activation signal. The activation signal applied to activation line 333 is at a logical high voltage level when the voltage at any reference word line is at the logical high voltage level, and is at a logical low voltage level when the voltages at all reference word lines in memory unit 310 are at a logical low voltage level. As described hereinbefore, data is read from memory unit 310 one byte at a time.

During the process of reading a byte of data that includes a bit of data stored in memory cell 113, the memory control signal applied to word line 116, the extraction signal applied to plate line 119, the reference control signal applied to reference word line 131, the reset signals applied to reset lines 133 and 134, the reference extraction signal applied to reference plate line 139, and the sense amplification signal and the pull down signal applied to sense amplifier 142 are activated in an order analogous to that of memory control signal 16A, extraction signal 19A, reference control signal 31A, reset signals 33A and 34A, reference extraction signal 39A, sense amplification signal 42A, and pull down signal 44A, respectively, as shown and described with reference to timing diagram 80 of FIG. 3. The operation of memory unit 310 to read data from memory cell 113 is analogous to that of data storage element 10 of FIG. 1, wherein memory cell 113 corresponds to memory cell 13, bit line 117 corresponds to bit line 17, and bit line 157 corresponds to reference bit line 37. Ferroelectric capacitor 325 is coupled to bit line 157 via FET 317. Ferroelectric capacitor 336 is coupled to bit line 157 via FETs 332 and 146. Ferroelectric capacitors 325 and 336 correspond to ferroelectric capacitors 25 and 26, respectively, of data storage element 10. Further, capacitor 148 is coupled to bit line 157 via conductive FET 146 and cooperates with capacitor 158 to perform a function analogous to reference bit line capacitor 38 of data storage element 10.

During the process of reading a byte of data that includes a bit of data stored in memory cell 153, the memory control signal applied to word line 156, the extraction signal applied to plate line 119, the reference control signal applied to reference word line 171, the reset signals applied to reset lines 133 and 134, the reference extraction signal applied to reference plate line 139, and the sense amplification signal and the pull down signal applied to sense amplifier 142 are activated in an order analogous to that of memory control signal 16A, extraction signal 19A, reference control signal 31A, reset signals 33A and 34A, reference extraction signal 39A, sense amplification signal 42A, and pull down signal 44A, respectively, as shown and described with reference to timing diagram 80 of FIG. 3. The operation of memory unit 310 to read data for memory cell 153 is analogous to that of data storage element 10 of FIG. 1, wherein memory cell 153 corresponds to memory cell 13, bit line 157 corresponds to bit line 17, and bit line 117 corresponds to reference bit line 37. Ferroelectric capacitor 325 is coupled to bit line 117 via FET 319. Ferroelectric capacitor 336 is coupled to bit line 117 via FETs 332 and 186. Ferroelectric capacitors 325 and 336 correspond to ferroelectric capacitors 25 and 26, respectively, of data storage element 10. Further, capacitor 148 is coupled to bit line 117 via conductive FET 186 and cooperates with capacitor 118 to perform a function analogous to reference bit line capacitor 38 of data storage element 10.

Figure 8:
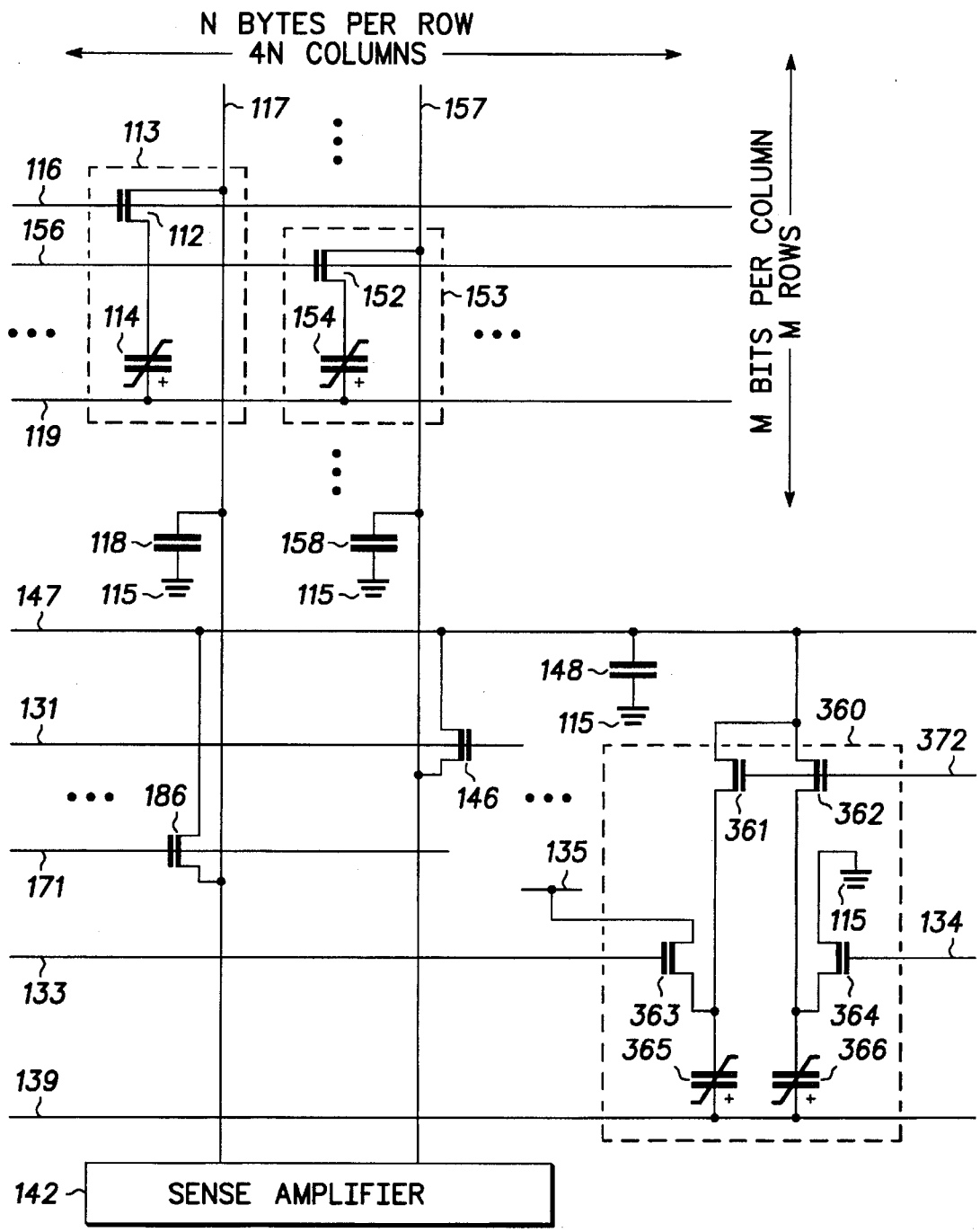
FIG. 8 is a schematic diagram of a non-volatile memory unit in accordance with a sixth embodiment of the present invention.

FIG. 8 is a schematic diagram of a non-volatile memory unit 340 in accordance with a sixth embodiment of the present invention. By way of example, memory unit 340 stores up to M×N bytes of data, where M and N are integers, and the data is written to or read from memory unit 310 one byte at a time. Memory unit 340 includes memory cells arranged in M rows, wherein each row has two arrays of memory cells and each array has 4N memory cells. Like memory unit 110 shown in FIG. 4, memory unit 210 shown in FIG. 5, memory unit 240 shown in FIG. 6, and memory unit 310 shown in FIG. 7, memory unit 340 includes 2M word lines, a plate line, 8N bit lines, eight reference capacitance lines, and 4N sense amplifiers partitioned into N/2 sets. The structures of memory cells, word lines, plate line, bit lines, reference capacitance lines and sense amplifiers are identical to those of memory unit 110 shown in FIG. 4. It should be understood that the same reference numerals are used in the figures to denote the same elements.

Memory unit 340 also includes eight capacitance line reference cells, each capacitance line reference cell coupled to a reference capacitance line. Reference cell 360 is shown in FIG. 8 as a representative capacitance line reference cell.

Reference cell 360 includes FETs 361, 362, 363, and 364, and ferroelectric capacitors 365 and 366. A gate electrode of FET 361 and a gate electrode of FET 362 are connected together and to an activation line 372. A drain electrode of FET 361 and a drain electrode of FET 362 are connected together and connected to reference capacitance line 147. A source electrode of FET 361 is connected to a source electrode of FET 363 and to a first electrode of ferroelectric capacitor 365. A gate electrode of FET 363 is connected to reset line 133. A drain electrode of FET 363 is connected to voltage supply conductor 135. A source electrode of FET 362 is connected to a source electrode of FET 364 and to a first electrode of ferroelectric capacitor 366. A gate electrode of FET 364 is connected to reset line 134. A drain electrode of FET 364 is connected to voltage supply conductor 115. A second electrode of ferroelectric capacitor 365 and a second electrode of ferroelectric capacitor 366 are connected to reference plate line 139.

Ferroelectric capacitors 365 and 366 are reference capacitors for providing a reference voltage when reading data from memory unit 310. The voltage across ferroelectric capacitors 365 and 366 is defined as positive when the potential at the electrode of the corresponding capacitor connected to reference plate line 139, i.e., the electrode identified with a positive sign in FIG. 8, is higher than the potential at the electrode connected to the respective FETs 363 and 364. The polarity of the polarization charge in ferroelectric capacitors 365 and 366 is defined as positive when the charge on the electrode of the corresponding capacitor with the positive sign (FIG. 8) is positive. Preferably, ferroelectric capacitors 114, 154, 365, and 366 are fabricated using the same process as ferroelectric capacitors 114 and 154. Further, the sizes and shapes of the ferroelectric capacitors 114, 154, 365, and 366 are preferably identical to each other. Thus, the capacitances of ferroelectric capacitors 365 and 366 track the capacitances of ferroelectric capacitors 114 and 154.

FETs 361, 362, 363, and 364 serve as switches. Although FIG. 8 shows FETs 361, 362, 363, and 364 as n-channel insulated gate field effect transistors, this is not a limitation of the present invention. FETs 361, 362, 363, and 364 may be replaced by any type of switch having control electrodes and current conducting electrodes such as, for example, CMOS pass gates, bipolar transistors, MESFETs, or the like.

It should be understood that data in a memory unit like memory unit 340 is not limited to being accessed one byte at a time and that the number of reference capacitance lines like reference capacitance line 147 is not limited to being eight. In accordance with the present invention, data in a memory unit like memory unit 340 is accessed one block at a time, wherein a block may include any number of bits of data. The number of reference capacitance lines, e.g., reference capacitance line 147, is preferably equal to the number of bits in a block of data and the number of reference word lines like reference word lines 131 and 171 is preferably equal to the number of blocks of data in a row of memory unit 340. Further, the sense amplifiers like sense amplifier 142 are partitioned into a number of sets, wherein the number of sense amplifiers in each set is preferably equal to the number of bits in a block of data and the number of sets is preferably equal to one half of the number of blocks of data in a row.

In order to write data into and read data from memory unit 340, the word lines, plate line, reference word lines, reset lines, reference plate line and sense amplifiers are coupled for receiving their respective signals like memory unit 110 shown in FIG. 4. Furthermore, activation line 372 is coupled for receiving an activation signal. The activation signal applied to activation line 372 is at a logical high voltage level when the voltage at any reference word line is at the logical high voltage level, and is at a logical low voltage level when the voltages at all reference word lines in memory unit 340 are at a logical low voltage level. As described hereinbefore, data is read from memory unit 340 one byte at a time.

During the process of reading a byte of data that includes a bit of data stored in memory cell 113, the memory control signal applied to word line 116, the extraction signal applied to plate line 119, the reference control signal applied to reference word line 131, the reset signals applied to reset lines 133 and 134, the reference extraction signal applied to reference plate line 139, and the sense amplification signal and the pull down signal applied to sense amplifier 142 are activated in an order analogous to that of memory control signal 16A, extraction signal 19A, reference control signal 31A, reset signals 33A and 34A, reference extraction signal 39A, sense amplification signal 42A, and pull down signal 44A, respectively, as shown and described with reference to timing diagram 80 of FIG. 3. The operation of reading data from memory cell 113 is analogous to that of data storage element 10 of FIG. 1, wherein memory cell 113 corresponds to memory cell 13, bit line 117 corresponds to bit line 17, and bit line 157 corresponds to reference bit line 37. Ferroelectric capacitor 365 is coupled to bit line 157 via FETs 361 and 146. Ferroelectric capacitor 366 is coupled to bit line 157 via FETs 362 and 146. Ferroelectric capacitors 365 and 366 correspond to ferroelectric capacitors 25 and 26, respectively, of data storage element 10. Further, capacitor 148 is coupled to bit line 157 via conductive FET 146 and cooperates with capacitor 158 to perform a function analogous to reference bit line capacitor 38 of data storage element 10.

During the process of reading a byte of data that includes a bit of data stored in memory cell 153, the memory control signal applied to word line 156, the extraction signal applied to plate line 119, the reference control signal applied to reference word line 171, the reset signals applied to reset lines 133 and 134, the reference extraction signal applied to reference plate line 139, and the sense amplification signal and the pull down signal applied to sense amplifier 142 are activated in an order analogous to that of memory control signal 16A, extraction signal 19A, reference control signal 31A, reset signals 33A and 34A, reference extraction signal 39A, sense amplification signal 42A, and pull down signal 44A, respectively, as shown and described with reference to timing diagram 80 of FIG. 3. The operation of reading data from memory cell 153 is analogous to that of data storage element 10 of FIG. 1, wherein memory cell 153 corresponds to memory cell 13, bit line 157 corresponds to bit line 17, and bit line 117 corresponds to reference bit line 37. Ferroelectric capacitor 365 is coupled to bit line 117 via FETs 361 and 186. Ferroelectric capacitor 366 is coupled to bit line 117 via FETs 362 and 186. Ferroelectric capacitors 365 and 366 correspond to ferroelectric capacitors 25 and 26, respectively, of data storage element 10. Further, capacitor 148 is coupled to bit line 117 via conductive FET 186 and cooperates with capacitor 118 to perform a function analogous to reference bit line capacitor 38 of data storage element 10.

By now it should be appreciated that a non-volatile data storage element and a method for reading data from the non-volatile data storage element have been provided. The non-volatile data storage element of the present invention uses a compact 1T/1C FERAM structure. Two reference ferroelectric capacitors provide the reference voltage during the process of reading data from the FERAM. In accordance with the present invention, the two reference ferroelectric capacitors are fabricated in the same process and having the same shape and size as the ferroelectric capacitors in the memory cells of FERAM, so that the capacitance of a reference ferroelectric capacitor tracks the capacitance of a memory cell ferroelectric capacitor over process and temperature variations. Further, the two reference ferroelectric capacitors are in complementary polarization states. Therefore, the reference voltage provided by the two reference ferroelectric capacitors is reliable and insensitive to process and temperature variations.

We claim:

1. A data storage element, comprising:
   a first memory cell having a control terminal, a data terminal, and a cell plate terminal, wherein the control terminal is coupled for receiving a first memory control signal, the data terminal is coupled for transmitting a data signal, and the cell plate terminal is coupled for receiving a first extraction signal; and
   a first reference which comprises:
      a first reference capacitor with polarization retention having a first electrode and a second electrode, the first electrode coupled for receiving a second extraction signal;
      a first switch having a control electrode, a first current conducting electrode, and a second current conducting electrode, wherein the control electrode is coupled for receiving a first reset signal, the first current conducting electrode is coupled to the second electrode of the first reference capacitor, and the second current conducting electrode is coupled to a first voltage supply conductor;
      a second switch having a control electrode, a first current conducting electrode, and a second current conducting electrode, wherein the control electrode is coupled for receiving a first reference control signal, the first current conducting electrode is coupled to the second electrode of the first reference capacitor, and the second current conducting electrode is coupled for transmitting a reference signal;
      a second reference capacitor with polarization retention having a first electrode and a second electrode, the first electrode coupled for receiving the second extraction signal;
      a third switch having a control electrode, a first current conducting electrode, and a second current conducting electrode, wherein the control electrode is coupled for receiving a second reset signal, the first current conducting electrode is coupled to the second electrode of the second reference capacitor, and the second current conducting electrode is coupled to a second voltage supply conductor; and
      a fourth switch having a control electrode, a first current conducting electrode, and a second current conducting electrode, wherein the control electrode is coupled to the control electrode of the second switch, the first current conducting electrode is coupled to the second electrode of the second reference capacitor, and the second current conducting electrode is coupled to the second current conducting electrode of the second switch.

2. The data storage element of claim 1, wherein the first memory cell comprises:
   a ferroelectric capacitor having a first electrode and a second electrode, the first electrode serving as the cell plate terminal of the first memory cell; and a pass gate having a control electrode, a first current conducting electrode, and a second current conducting electrode, wherein the control electrode serves as the control terminal of the first memory cell, the first current conducting electrode is coupled to the second electrode Of the ferroelectric capacitor of the first memory cell, and the second current conducting electrode serves as the data terminal of the first memory cell.

3. The data storage element of claim 2, wherein the pass gate, the first switch, the second switch, the third switch, and the fourth switch are field effect transistors.

4. The data storage element of claim 2, wherein the first reference capacitor and the second reference capacitor are ferroelectric capacitors, and a capacitance of the first reference capacitor and a capacitance of the second reference capacitor are equal to a capacitance of the ferroelectric capacitor of the first memory cell.

5. The data storage element of claim 1, further comprising a sense amplifier having a first terminal and a second terminal, the first terminal coupled to the data terminal of the first memory cell and the second terminal coupled to the second current conducting electrode of the second switch.

6. The data storage element of claim 5, further comprising:
- a second memory cell having a control terminal, a data terminal, and a cell plate terminal, wherein the control terminal is coupled for receiving a second memory control signal, the data terminal is coupled to the second terminal of the sense amplifier, and the cell plate terminal is coupled for receiving the first extraction signal;
- a reference capacitance line;
- a first coupling switch having a control electrode, a first current conducting electrode, and a second current conducting electrode, wherein the control electrode is coupled for receiving the first reference control signal, the first current conducting electrode is coupled to the reference capacitance line, and the second current conducting electrode is coupled to the second terminal of the sense amplifier; and
- a second coupling switch having a control electrode, a first current conducting electrode, and a second current conducting electrode, wherein the control electrode is coupled for receiving a second reference control signal, the first current conducting electrode is coupled to the reference capacitance line, and the second current conducting electrode is coupled to the first terminal of the sense amplifier.

7. The data storage element of claim 6, further comprising:
- a fifth switch having a control electrode, a first current conducting electrode, and a second current conducting electrode, the control electrode coupled for receiving the second reference control signal, the first current conducting electrode coupled to the second electrode of the first reference capacitor, and the second current conducting electrode coupled to the first terminal of the sense amplifier; and
- a sixth switch having a control electrode, a first current conducting electrode, and a second current conducting electrode, the control electrode coupled to the control electrode of the fifth switch, the first current conducting electrode coupled to the second electrode of the second reference capacitor, and the second current conducting electrode coupled to the second current conducting electrode of the fifth switch.

8. The data storage element of claim 6, further comprising a second reference cell which comprises:
- a third reference capacitor with polarization retention having a first electrode and a second electrode, the first electrode coupled for receiving the second extraction signal;
- a fifth switch having a control electrode, a first current conducting electrode, and a second current conducting electrode, wherein the control electrode is coupled to the control electrode of the first switch, the first current conducting electrode is coupled to the second electrode of the third reference capacitor, and the second current conducting electrode is coupled to the first voltage supply conductor;
- a sixth switch having a control electrode, a first current conducting electrode, and a second current conducting electrode, wherein the control electrode is coupled for receiving the second reference control signal, the first current conducting electrode is coupled to the second electrode of the third reference capacitor, and the second current conducting electrode is coupled to the first terminal of the sense amplifier;
- a fourth reference capacitor with polarization retention having a first electrode and a second electrode, the first electrode coupled for receiving the second extraction signal;
- a seventh switch having a control electrode, a first current conducting electrode, and a second current conducting electrode, wherein the control electrode is coupled to the control electrode of the third switch, the first current conducting electrode is coupled to the second electrode of the fourth reference capacitor, and the second current conducting electrode is coupled to the second voltage supply conductor; and
- an eighth switch having a control electrode, a first current conducting electrode, and a second current conducting electrode, wherein the control electrode is coupled to the control electrode of the sixth switch, the first current conducting electrode is coupled to the second electrode of the fourth reference capacitor, and the second current conducting electrode is coupled to the second current conducting electrode of the sixth switch.

9. A memory unit having first and second word lines, first and second arrays of bit lines, and a plate line, comprising:
- a first array of memory cells, a memory cell in the first array of memory cells having a control terminal coupled to the first word line, a data terminal coupled to a corresponding bit line in the first array of bit lines, and a cell plate terminal coupled to the plate line, wherein the memory cell includes:
  - a capacitor with polarization retention having a first electrode and a second electrode, the first electrode serving as the cell plate terminal of the memory cell; and
  - a pass gate having a control electrode, a first current conducting electrode, and a second current conducting electrode, wherein the control electrode serves as the control terminal of the memory cell, the first current conducting electrode is coupled to the second electrode of the capacitor, and the second current conducting electrode serves as the data terminal of the memory cell;
- a second array of memory cells, a memory cell in the second array of memory cells having a control terminal coupled to the second word line, a data terminal coupled to a corresponding bit line in the second array of bit lines, and a cell plate terminal coupled to the plate line;

a plurality of sense amplifiers, a sense amplifier of the plurality of sense amplifiers having a first terminal coupled to the corresponding bit line in the first array of bit lines and a second terminal coupled to the corresponding bit line in the second array of bit lines;

a plurality of reference capacitance lines;

a first array of switches, a switch in the first array of switches having a control electrode coupled for receiving a first reference control signal, a first current conducting electrode coupled to a corresponding reference capacitance line of the plurality of reference capacitance lines, and a second current conducting electrode coupled to the corresponding bit line in the second array of bit lines;

a second array of switches, a switch in the second array of switches having a control electrode coupled for receiving a second reference control signal, a first current conducting electrode coupled to the corresponding reference capacitance line, and a second current conducting electrode coupled to the corresponding bit line in the first array of bit lines;

a first set of reference capacitors with polarization retention, a reference capacitor in the first set of reference capacitors having a first electrode coupled for receiving a reference extraction signal and a second electrode;

a first set of switches, a switch in the first set of switches having a control electrode coupled for receiving a first reset signal, a first current conducting electrode coupled to the second electrode of the reference capacitor in the first set of reference capacitors, and a second current conducting electrode coupled to a first voltage supply conductor;

a second set of switches, a switch in the second set of switches having a control electrode coupled for receiving the first reference control signal, a first current conducting electrode coupled to the second electrode of the reference capacitor in the first set of reference capacitors, and a second current conducting electrode coupled to the corresponding bit line in the second array of bit lines;

a second set of reference capacitors with polarization retention, a reference capacitor in the second set of reference capacitors having a first electrode coupled for receiving the reference extraction signal and a second electrode;

a third set of switches, a switch in the third set of switches having a control electrode coupled for receiving a second reset signal, a first current conducting electrode coupled to the second electrode of the reference capacitor in the second set of reference capacitors, and a second current conducting electrode coupled to a second voltage supply conductor; and a fourth set of switches, a switch in the fourth set of switches having a control electrode coupled for receiving the first reference control signal, a first current conducting electrode coupled to the second electrode of the reference capacitor in the second set of reference capacitors, and a second current conducting electrode coupled to the corresponding bit line in the second array of bit lines.

10. The memory unit of claim 9, further comprising:

a third set of reference capacitors with polarization retention, a reference capacitor in the third set of reference capacitors having a first electrode coupled for receiving the reference extraction signal and a second electrode;

a fifth set of switches, a switch in the fifth set of switches having a control electrode coupled for receiving the first reset signal, a first current conducting electrode coupled to the second electrode of the reference capacitor in the third set of reference capacitors, and a second current conducting electrode coupled to the first voltage supply conductor;

a sixth set of switches, a switch in the sixth set of switches having a control electrode coupled for receiving the second reference control signal, a first current conducting electrode coupled to the second electrode of the reference capacitor in the third set of reference capacitors, and a second current conducting electrode coupled to the corresponding bit line in the first array of bit lines;

a fourth set of reference capacitors with polarization retention, a reference capacitor in the fourth set of reference capacitors having a first electrode coupled for receiving the reference extraction signal and a second electrode;

a seventh set of switches, a switch in the seventh set of switches having a control electrode coupled for receiving the second reset signal, a first current conducting electrode coupled to the second electrode of the reference capacitor in the fourth set of reference capacitors, and a second current conducting electrode coupled to the second voltage supply conductor; and an eighth set of switches, a switch in the eighth set of switches having a control electrode coupled to the control electrode of the switch in the sixth set of switches, a first current conducting electrode coupled to the second electrode of the reference capacitor in the fourth set of reference capacitors, and a second current conducting electrode coupled to the second current conducting electrode of the switch in the sixth set of switches.

11. The memory unit of claim 9, further comprising:

a fifth set of switches, a switch in the fifth set of switches having a control electrode, a first current conducting electrode, and a second current conducting electrode, the control electrode coupled for receiving the second reference control signal, the first current conducting electrode coupled to the second electrode of the reference capacitor in the first set of reference capacitors, and the second current conducting electrode coupled to the corresponding bit line in the first array of bit lines; and a sixth set of switches, a switch in the sixth set of switches having a control electrode, a first current conducting electrode, and a second current conducting electrode, the control electrode coupled to the control electrode of the switch in the fifth set of switches, the first current conducting electrode coupled to the second electrode of the reference capacitor in the second set of reference capacitors, and the second current conducting electrode coupled to second current conducting electrode of the switch in the fifth set of switches.

12. The memory unit of claim 9, wherein the second current conducting electrode of the switch in the second set of switches is coupled to the corresponding bit line in the second array of bit lines via the first and second current conducting electrodes of the switch in the first array of switches and coupled to the corresponding bit line in the first array of bit lines via the first and second current conducting electrodes of the switch in the second array of switches, and wherein the control electrode of the switch in the second set of switches is further coupled for receiving the second reference control signal.

13. The memory unit of claim 12, wherein the second current conducting electrode of the switch in the fourth set of switches is coupled to the corresponding bit line in the second array of bit lines via the first and second current conducting electrodes of the switch in the first array of switches and coupled to the corresponding bit line in the first array of bit lines via the first and second current conducting electrodes of the switch in the second array of switches, and wherein the control electrode of the switch in the fourth set of switches is further coupled for receiving the second reference control signal.

14. The memory unit of claim 12, further comprising a fifth set of switches, a switch in the fifth set of switches having a control electrode coupled for receiving the second reference control signal, a first current conducting electrode coupled to the second electrode of the reference capacitor in the second set of reference capacitors, and a second current conducting electrode coupled to the corresponding bit line in the first array of bit lines.

15. The memory unit of claim 12, further comprising:
    a third set of reference capacitors with polarization retention, a reference capacitor in the third set of reference capacitors having a first electrode coupled for receiving the reference extraction signal and a second electrode;
    a fifth set of switches, switch in the fifth set of switches having a control electrode coupled for receiving the second reset signal, a first current conducting electrode coupled to the second electrode of the reference capacitor in the third set of reference capacitors, and a second current conducting electrode coupled to the second voltage supply conductor; and
    a sixth set of switches, a switch in the sixth set of switches having a control electrode coupled for receiving the second reference control signal, a first current conducting electrode coupled to the second electrode of the reference capacitor in the third set of reference capacitors, and a second current conducting electrode coupled to the corresponding bit line in the first array of bit lines.

16. A method for reading data from a non-volatile memory unit, comprising the steps of:
    providing the non-volatile memory unit having a memory capacitor with polarization retention, a first reference capacitor with polarization retention, a second reference capacitor with polarization retention, a first bit line, and a second bit line;
    placing the first reference capacitor in a first polarization state;
    placing the second reference capacitor in a second polarization state complementary to the first polarization state;
    coupling the second electrode of the memory capacitor to the first bit line;
    coupling the second electrodes of the first and second reference capacitors to the second bit line;
    applying a first memory extraction voltage to a first electrode of the memory capacitor;
    applying a first reference extraction voltage to the first electrodes of the first and second reference capacitors;
    generating a data value voltage across the first and second bit lines, wherein a polarity of the data value voltage is identical to a polarity of a potential difference between the first and second bit lines;
    sensing the data value voltage to read a logic value from the non-volatile memory unit;
    applying a second memory extraction voltage to the first electrode of the memory capacitor; and
    restoring the logic value in the non-volatile memory unit by decoupling the second electrode of the memory capacitor from the first bit line.

17. The method for reading data from a non-volatile memory unit as claimed in claim 16, wherein the steps of placing the first reference capacitor in a first polarization state and placing the second reference capacitor in a second polarization include the steps of:
    applying a first voltage across first and second electrodes of the first reference capacitor, the first voltage having a first polarity;
    removing the first voltage applied across the first and second electrodes of the first reference capacitor;
    applying a second voltage across first and second electrodes of the second reference capacitor, the second voltage having a second polarity opposite to the first polarity; and
    removing the second voltage applied across the first and second electrodes of the second reference capacitor.

18. The method for reading data from a non-volatile memory unit as claimed in claim 17, wherein the step of removing the first voltage applied across the first and second electrodes of the first reference capacitor further includes the step of discharging the first reference capacitor and wherein the step of removing the second voltage applied across the first and second electrodes of the second reference capacitor further includes the step of discharging the second reference capacitor.

19. The method for reading data from a non-volatile memory unit as claimed in claim 16, further comprising the step of applying a potential to the first bit line and the second bit line.

20. The method for reading data from a non-volatile memory unit as claimed in claim 16, wherein the step of restoring the logic value in the non-volatile memory unit further includes the step of decoupling the first electrodes of the first and second reference capacitors from the second bit line.

* * * * *